United States Patent
Dueggeli et al.

(10) Patent No.: US 8,729,220 B2
(45) Date of Patent: May 20, 2014

(54) ANNELLATED DITHIOPHENE COPOLYMERS

(75) Inventors: Mathias Dueggeli, Thürnen (DE); Ralph Reiger, Darmstadt (DE); Klaus Muellen, Köln (DE); Natalia Chebotareva, Hagenthal le Bas (FR); Dirk Beckmann, Harxheim (DE)

(73) Assignee: BASF SE, Ludwigshafen (DE)

( * ) Notice: Subject to any disclaimer, the term of this patent is extended or adjusted under 35 U.S.C. 154(b) by 486 days.

(21) Appl. No.: 13/074,725

(22) Filed: Mar. 29, 2011

(65) Prior Publication Data

US 2011/0240973 A1  Oct. 6, 2011

Related U.S. Application Data

(60) Provisional application No. 61/319,271, filed on Mar. 31, 2010.

(51) Int. Cl.
*C08G 75/00* (2006.01)

(52) U.S. Cl.
USPC ............ 528/377; 528/378; 528/380; 428/690

(58) Field of Classification Search
USPC .................................. 428/690; 528/377, 380
See application file for complete search history.

(56) References Cited

U.S. PATENT DOCUMENTS

| 2009/0065770 | A1 | 3/2009 | Miura et al. |
| 2010/0327273 | A1 | 12/2010 | Li et al. |
| 2011/0065895 | A1 | 3/2011 | Miura et al. |

FOREIGN PATENT DOCUMENTS

| JP | 2007-112878 | 5/2007 |
| WO | 2009101982 | 8/2009 |
| WO | 2009105041 | 8/2009 |
| WO | 2010000669 | 7/2010 |

OTHER PUBLICATIONS

Xiao et al. (Macromolecules 2008, 41, 5688-5696).*

Ralph Reiger, et al., "Rational Optimization of Benzo[2,1-b;3,4-b']dithiophene-Containing Polymers for Organic Field-Effect Transistors", Advanced Materials, 2010, vol. 22, pp. 83-86.
Taerum et al., Org. Lett. 11, p. 3230 (2009).
Takimiya et al., Bull. Chem. Soc. JP 75, 1795 (2002).
PAJ 2007-112878 May 10, 2007.

* cited by examiner

*Primary Examiner* — Shane Fang
(74) *Attorney, Agent, or Firm* — Shruti Costales

(57) ABSTRACT

An organic semiconductor material, layer or component, comprising a copolymer of the formula $$*\text{-}[\text{A}]_v\text{-}[\text{COM}]_w\text{-}* ,\qquad(I)$$

wherein v and w each generally are from the range 4 to 1000; A is a benzodithiophene repeating unit of the formula II or III

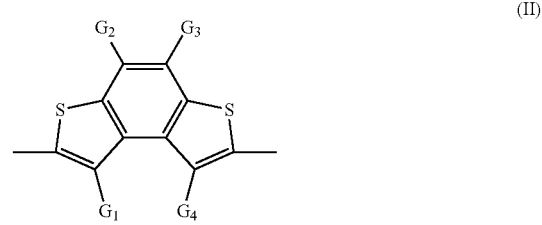
(II)

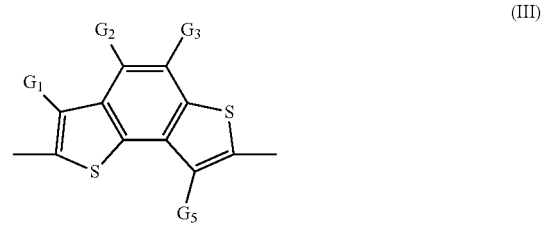

(III)

and COM is selected from certain arylene-type repeating units, and combinations thereof. The present copolymers, as well as composites thereof, may be used as semiconductor in the preparation of electronic devices such as photodiodes, organic field effect transistors and especially organic photovoltaic devices such as solar cells.

18 Claims, No Drawings

ANNELLATED DITHIOPHENE COPOLYMERS

This application claims the benefit of U.S. Provisional Application No. 61/319,271, filed Mar. 31, 2010.

The present invention relates to copolymers comprising one or more benzodithiophene (repeating) unit(s) of the class benzo[1,2-b;4,3-b']dithiophene and/or benzo[1,2-b;3,4-b']dithiophene, and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

Certain copolymers based on benzo[2,1-b;3,4-b'] dithiophene repeating units for use in organic field effect transistors have recently been presented (Rieger et al., Adv. Mater. 2010, 22, 83; WO10000669).

The materials available at the moment for use as organic semiconductors show potential, but do not yet satisfy all requirements for device production. From the practical point of view, it has turned out that conjugated polymers are very promising for large-scale production. They readily form homogeneous films from solution, enabling printing techniques such as inkjet or gravure printing. However, polymers do not yet show comparably high mobilities in field-effect transistors, and often do not show sufficient solubility in acceptable solvents such as hydrocarbons. In many cases, polymers with high tendency to pack into highly ordered films are sparingly soluble.

New copolymers have now been found showing good mobility and still retain the advantage of easy solution processing. The high aggregation tendency of benzodithiophene directs the polymer to highly ordered films, while the curvature contributes to the solubility facilitating film formation. Both monomers induce curvature due to their non-linear geometry.

First of all, the invention thus pertains to an organic semiconductor material, layer or component, comprising a copolymer corresponding to the formula

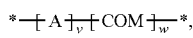

(I)

wherein
v and w each are from the range 4 to 1000, especially 4 to 200, very especially 5 to 100, the weight ratio v:w preferably ranging from 1:20 to 20:1;
A is a benzodithiophene repeating unit of the formula II or III

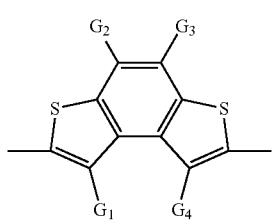

(II)

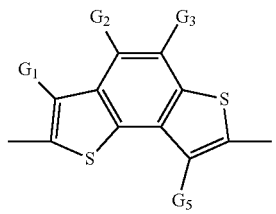

(III)

and COM is selected from repeating units of the formulae

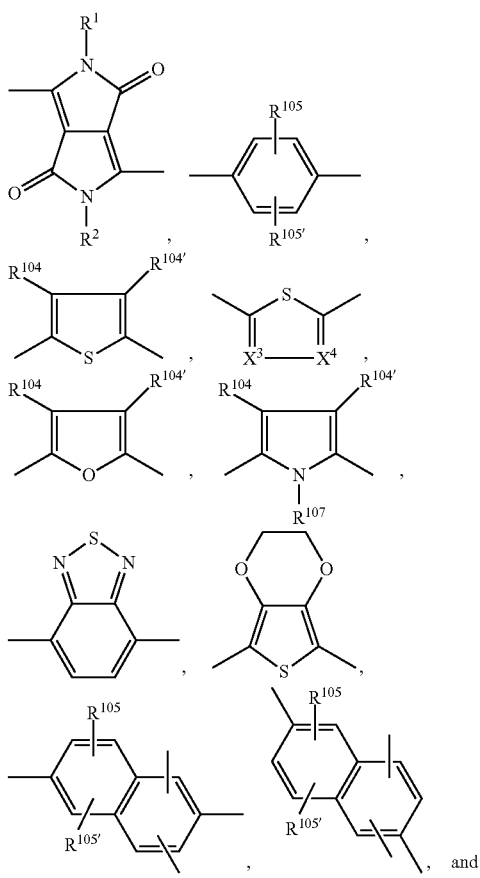

, and combinations thereof, wherein
$G_1$, $G_2$, $G_3$, $G_4$ and $G_5$ may be the same or different and are selected from hydrogen, halogen such as F, $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, $C_4$-$C_{25}$aryl, $C_5$-$C_{25}$alkylaryl or $C_5$-$C_{25}$aralkyl, each of which is unsubstituted or substituted by one or more halogen, hydroxy, nitro, —CN, or $C_6$-$C_{18}$aryl, and any alkyl of 2 or more carbon atoms may be interrupted by —O—, —COO—, —OCO—, —S—;
$R^1$ and $R^2$ may be the same or different and are selected from hydrogen, a $C_1$-$C_{100}$alkyl group, —COOR$^{103}$, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, $C_5$-$C_{12}$cycloalkyl, which can be substituted one to three times with $C_1$-$C_8$alkyl and/or $C_1$-$C_8$alkoxy, a $C_6$-$C_{24}$aryl group, in particular phenyl or 1- or 2 naphthyl which can be substituted one to three times with $C_1$-$C_8$alkyl, $C_1$-$C_8$thioalkoxy, and/or $C_1$-$C_8$alkoxy, or pentafluorophenyl;

$R_{103}$ is $C_1$-$C_{50}$alkyl;

$R^{99}$, $R^{104}$ and $R^{104'}$ are independently of each other hydrogen, halogen, or a $C_1$-$C_{25}$alkyl group, which may optionally be interrupted by one or more oxygen or sulphur atoms, $C_7$-$C_{25}$arylalkyl, or a $C_1$-$C_{25}$alkoxy group, $R^{105}$ and $R^{105'}$ independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is H; $C_6$-$C_{18}$aryl; $C_6$-$C_{18}$aryl which is substituted by $C_1$-$C_{18}$alkyl, or $C_1$-$C_{18}$alkyl; or $C_2$-$C_{18}$alkyl which is interrupted by —O—.

as well as composites comprising said semiconductor material as a thin film on a substrate, and corresponding semiconductor devices, especially photodiodes, organic field effect transistors and very especially organic photovoltaic (PV) devices (solar cells);

or COM is a repeating unit of formula

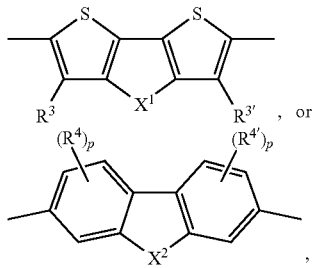, or

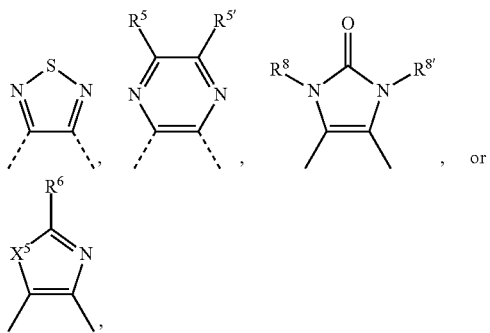, wherein p is 0, 1, 2, or 3;

$R^3$ and $R^{3'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{25}$alkoxy;

$R^4$ and $R^{4'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{25}$alkoxy;

$X^1$ and $X^2$ are independently of each other —O—, —S—, —NR$^8$—, —Si(R$^{11}$)(R$^{11'}$)—, —C(R$^7$)(R$^{7'}$)—, —C(=O)—, $X^5$ is —O—, or —NR$^8$—;

$R^5$ and $R^{5'}$ are independently of each other hydrogen, halogen, $C_1$-$C_{25}$alkyl, which may optionally be interrupted by one or more oxygen or sulphur atoms; $C_6$-$C_{24}$aryl, which may optionally be substituted one to three times with $C_1$-$C_8$alkyl and/or $C_1$-$C_8$alkoxy;

$C_7$-$C_{25}$arylalkyl, CN, or $C_1$-$C_{25}$alkoxy; or $R^5$ and $R^{5'}$ together form a ring, $R^6$ is H, $C_1$-$C_{18}$alkyl, which may optionally be interrupted by one or more oxygen or sulphur atoms, $C_1$-$C_{18}$perfluoroalkyl, $C_6$-$C_{24}$aryl, which may optionally be substituted one to three times with $C_1$-$C_8$alkyl and/or $C_1$-$C_8$alkoxy; $C_2$-$C_{20}$heteroaryl, which may optionally be substituted one to three times with $C_1$-$C_8$alkyl and/or $C_1$-$C_8$alkoxy; or CN, $R^7$ and $R^{7'}$ are independently of each other hydrogen, $C_1$-$C_{35}$alkyl, which may optionally be interrupted by one, or more oxygen, or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, especially $C_4$-$C_{25}$alkyl, which may optionally be interrupted by one or more oxygen or sulphur atoms; or $C_7$-$C_{25}$arylalkyl, $R^{11}$ and $R^{11'}$ are independently of each other $C_1$-$C_{35}$alkyl group, $C_7$-$C_{25}$arylalkyl, or a phenyl group, which optionally can be substituted one to three times with $C_1$-$C_8$alkyl and/or $C_1$-$C_8$alkoxy.

In some preferred copolymers of the formula I, $G_1$, $G_2$, $G_3$, $G_4$ and $G_5$ independently are selected from hydrogen, fluoro, $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, phenyl, naphthyl, $C_1$-$C_{12}$alkylphenyl, phenyl-$C_1$-$C_{12}$alkyl, each of which is unsubstituted or substituted by one or more fluoro, —CN, phenyl, naphthyl;

$R^1$ and $R^2$ may be the same or different and are selected from $C_1$-$C_{100}$alkyl, $C_5$-$C_{12}$cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —CR$^{101}$R$^{102}$—(CH$_2$)$_u$-A$^3$, wherein $R^{101}$ and $R^{102}$ stand for hydrogen or $C_1$-$C_4$alkyl, $A^3$ stands for phenyl or 1- or 2-naphthyl each of which can be substituted one to three times with $C_1$-$C_8$alkyl and/or $C_1$-$C_8$alkoxy, and u stands for 0, 1, 2, or 3; $R^{103}$ is $C_1$-$C_{25}$alkyl;

one of $X^3$ and $X^4$ is N and the other is $CR^{99}$, $R^{99}$, $R^{104}$ and $R^{104'}$ are independently of each other hydrogen, F, or a $C_1$-$C_{25}$alkyl group, which may optionally be interrupted by one or more oxygen or sulphur atoms, $C_7$-$C_{25}$phenylalkyl, $C_1$-$C_{12}$alkoxy, $R^{105}$ and $R^{105'}$ independently of each other hydrogen, fluoro, $C_1$-$C_{25}$alkyl, which may optionally be interrupted by, one or more oxygen or sulphur atoms; $C_7$-$C_{25}$phenylalkyl, or $C_1$-$C_{18}$alkoxy, $R^{107}$ is H; phenyl or naphthyl which is optionally substituted by $C_1$-$C_{18}$alkyl or $C_1$-$C_{18}$alkoxy; $C_1$-$C_{18}$alkyl; or $C_2$-$C_{18}$alkyl which is interrupted by —O—.

especially where $G_1$, $G_2$, $G_3$, $G_4$ and $G_5$ independently are selected from hydrogen, fluoro, $C_1$-$C_{25}$alkyl; and especially are hydrogen;

$R^1$ and $R^2$ are $C_1$-$C_{35}$alkyl, especially a $C_8$-$C_{35}$alkyl group, and each $R^{104}$ and $R^{104'}$ independently is selected from H, $C_1$-$C_{25}$alkyl.

Examples are materials or devices, where in the copolymer of the formula I the moiety COM is selected from repeating units of the formulae

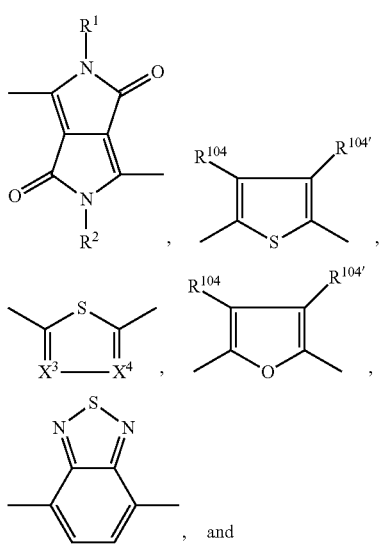
, and combinations thereof, such as in the following building blocks:

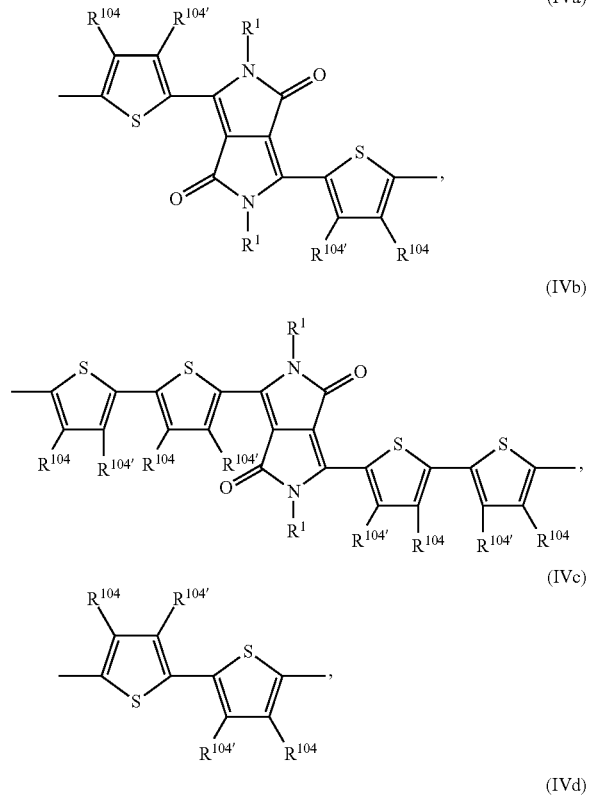

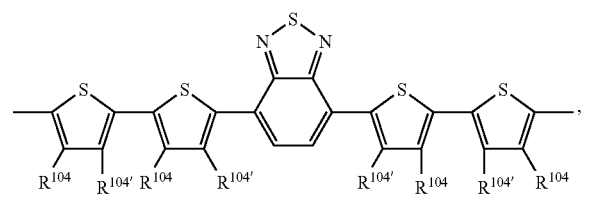

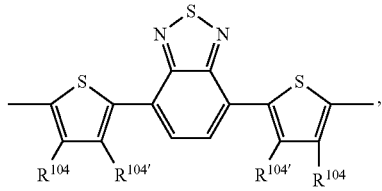

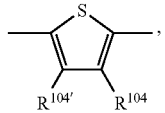

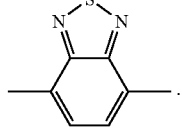

Some more specific examples are copolymers conforming to the formula XII or XIII

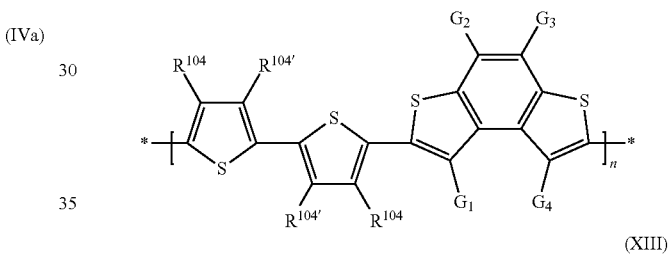

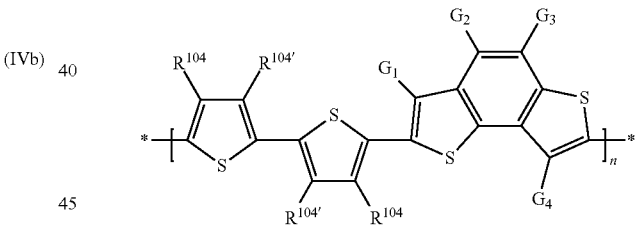

wherein n ranges from 4 to 300, especially from 10 to 200.

The copolymers are preferably of a molecular weight range (weight average as determined by GPC; Mw) from 5000 to about 200000, especially from about 10000 to about 120000, for example 50000 to 100000, in order to obtain a material combining optimum semiconductor and solubility properties (Mw of 10000 stands for 10000 Dalton, which is 10 kg/mol).

The number average molecular weight Mn is preferably in the range of from 10,000 to 100,000 g/mol.

The copolymers of formula I are novel compounds, preferred species and classes among them are as defined for the materials and devices of the invention described above.

The polymers may be end-capped by several groups as known from the prior art. Preferred end groups are H, substituted or unsubstituted phenyl or substituted or unsubstituted thiophene, without being restricted thereto. Chain termination is often effected by monofunctional monomers, i.e. formula I terminates on both ends often, for example, with hydrogen, phenyl or $C_1$-$C_{25}$alkyl. The units A and COM in formula I may be distributed statistically or in blocks; preferred are regular copolymers of the type . . . A-COM-A-COM-A-COM . . . etc.; similarly, several divalent aromatic units forming one unit COM may be distributed in a regular manner; a preferred class of copolymers contains units COM which are end-capped by thiophenyl

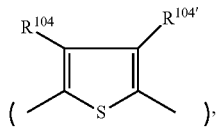

and wherein further monomer units

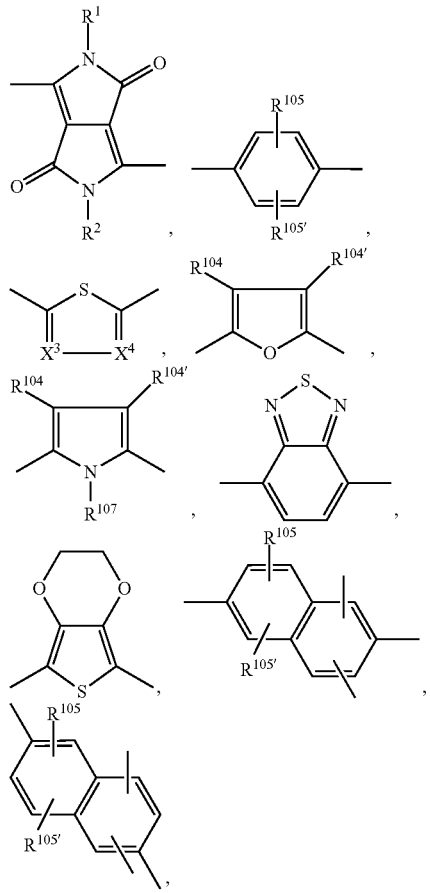

if present, are separated by one or more thienyl units (also denoted in the present context as thiophenyl units;

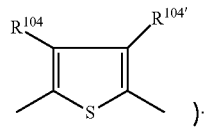

Any alkyl group, such as $R^1$ and $R^2$ as a $C_1$-$C_{36}$alkyl group, or R104 or R104' as $C_1$-$C_{25}$alkyl, include, for example methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, especially n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. In a particularly preferred embodiment of the present invention, $R^1$ and $R^2$ are a 2-hexyldecyl, or 2-decyl-tetradecyl group.

Advantageously, the groups $R^1$ and $R^2$ can be represented by formula

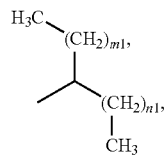

wherein m1=n1+4 and m2+n1≤22. Chiral side chains, such as $R^1$ and $R^2$, can either be homochiral, or racemic, or have opposite chirality, which can influence the morphology of the compounds of formula I in the solid state.

"Alkenyl" refers to a straight-chain or branched alkyl group having one or more carbon-carbon double bonds. Examples are ethenyl, propenyl, butenyl, pentenyl, hexenyl, butadienyl, pentadienyl, hexadienyl groups. The one or more carbon-carbon double bonds can be internal (such as in 2-butene) or terminal (such as in 1-butene). In various embodiments, an alkenyl group can have 2 to 20 carbon atoms. In some embodiments, alkenyl groups can be substituted as disclosed herein. An alkenyl group is generally not substituted with another alkenyl group, an alkyl group, or an alkynyl group.

"Alkynyl" refers to a straight-chain or branched alkyl group having one or more triple carbon-carbon bonds. Examples include ethynyl, propynyl, butynyl, pentynyl. The one or more triple carbon-carbon bonds can be internal (such as in 2-butyne) or terminal (such as in 1-butyne). In various embodiments, an alkynyl group can have 2 to 20 carbon atoms. In some embodiments, alkynyl groups can be substituted as disclosed herein. An alkynyl group is generally not substituted with another alkynyl group, an alkyl group, or an alkenyl group.

"Cycloalkyl" refers to a non-aromatic carbocyclic group including cyclized alkyl, alkenyl, and alkynyl groups. A preferred cycloalkyl group can have 3 to 10 carbon atoms. A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. Cycloalkyl groups can be substituted as disclosed herein.

"Aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 14 carbon atoms in its ring system, which can include multiple fused rings. Preferred aryl groups having only aromatic carbocyclic ring(s) include phenyl, 1-naphthyl (bicyclic), 2-naphthyl (bicyclic), anthracenyl (tricyclic), phenanthrenyl (tricyclic). Preferred polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Further preferred aryl groups include benzodioxanyl, benzodioxolyl, chromanyl, indolinyl groups, and the like. In some embodiments, aryl groups can be substituted as disclosed herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C$_6$F5), are included within the definition of "haloaryl." In certain embodiments, an aryl group is substituted with another aryl group and can be referred to as a biaryl group. Each of the aryl groups in the biaryl group can be substituted or unsubstituted.

"Heteroaryl" refers to an aromatic monocyclic or polycyclic ring system containing at least one ring heteroatom. The heteroatom is preferably selected from oxygen (O), nitrogen (N), sulfur (S), silicon (Si), and selenium (Se) or a polycyclic ring system without being restricted thereto. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group can have from 5 to 14 ring atoms and contain 1-5 ring heteroatoms.

$R^{104}$ or $R^{104'}$ is particularly preferred H or, especially one of $R^{104}$ or $R^{104'}$, prefereably linear or branched C6-C20 alkyl, e.g. n-hexyl, n-heptyl, n-octyl, n-nonyl, n-decyl, n-undecyl, n-dodecyl, n-tridecyl, n-tetradecyl, n-pentadecyl, n-hexadecy, n-heptadecyl, n-octadecy, n-nonadecyl, n-isosyl, 1-methylpentyl, 1-methylhexyl, 2-methylpentyl, 2-ethylhexyl, and 2,7-dimethyloctyl. Particularly preferred are 2,6-dimethyloctyl, 1-ethylhexyl,1-methylhexyl, 2-ethylpentyl, 2-methylhexyl, n-decyl, n-dodecyl, n-tetradecyl, and 2-ethylhexyl, most preferred is n-dodecyl.

"Mobility" or "mobility" refers to a measure of the velocity with which charge carriers induced by an external stimulus such as an electric field, for example, holes (or units of positive charge) in the case of a p-type semiconducting material and electrons in the case of an n-type semiconducting material, move through the material under the influence of an electric field.

As indicated by the formula

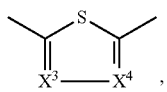

the group

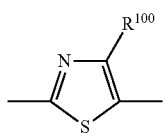

can be arranged in the polymer chain in two ways

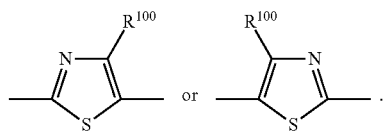

The notation

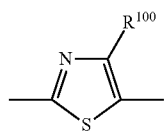

should comprise both possibilities. The same applies for other groups, which can be arranged in different ways in the monomer and/or polymers.

If COM is derived from a group of formula

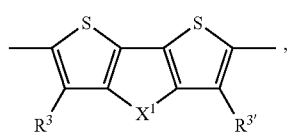

it is preferably a repeating unit of formula

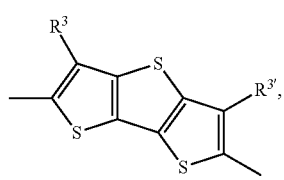

(Xa)

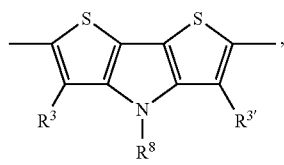

(Xb)

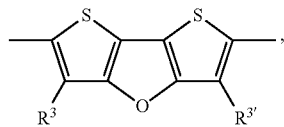

(Xc)

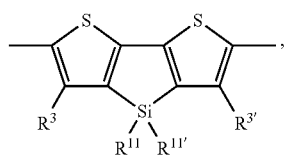

(Xd)

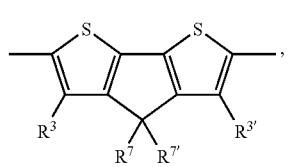

(Xe)

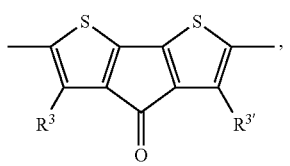 (Xf),

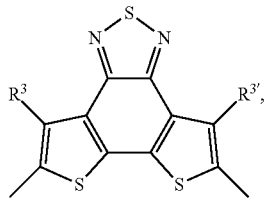 (Xg),

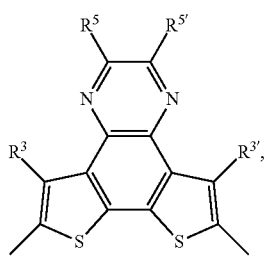 (Xh),

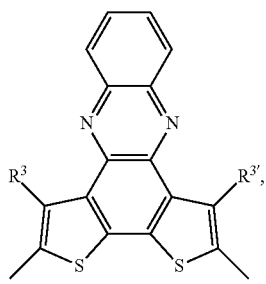 (Xi),

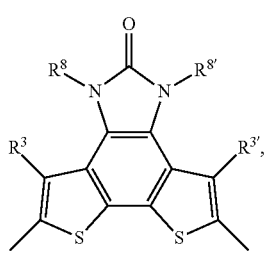 (Xj),

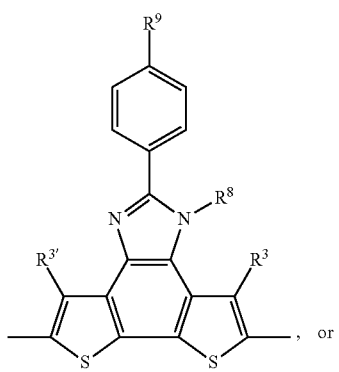 (Xk), or

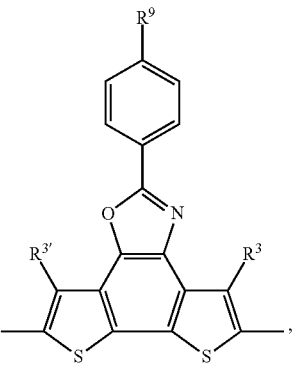 (Xl), wherein
$R^3$, $R^{3'}$, $R^5$, $R^{5'}$, $R^7$, $R^{7'}$, $R^8$, $R^{8'}$, $R^{11}$ and $R^{11'}$ are as defined above and
$R^9$ is $C_1$-$C_{25}$alkyl, which may optionally be interrupted by one or more oxygen or sulphur atoms, $C_1$-$C_{25}$perfluoroalkyl, $C_1$-$C_{25}$alkoxy, or CN. Groups of formula Xd, Xe, Xf, Xg, Xh and Xk are preferred, groups of formula Xd, Xe, Xh and Xk are most preferred.

The present invention thus includes a semiconductor device comprising a copolymer (I) as defined above. The copolymer of the invention usually forms a major active constituent of one or more semiconducting layers in said device, which is, for example, an organic photovoltaic (PV) device or solar cell, a photodiode, or an organic field effect transistor, or a device containing a photodiode and/or an organic field effect transistor.

The present invention further provides for the use of the copolymers according to the present invention as semiconductors or charge transport materials, especially in optical, electrooptical or electronic components, as thin-film transistors, especially in flat visual display units, or for radiofrequency identification tags (RFID tags) or in semiconductor components for organic light-emitting diodes (OLEDs), such as electroluminescent displays or backlighting for liquid-crystalline displays, for photovoltaic components or in sensors, as electrode material in batteries, as optical waveguides, for electrophotography applications such as electrophotographic recording.

The present invention further provides optical, electrooptical or electronic components comprising the polymer according to the present invention. Such components may be, for example, FETs, integrated circuits (ICs), TFTs, OLEDs or alignment layers.

The conductive form of the copolymers according to the present invention can be used as an organic conductor, for example charge injection layers and ITO planarizing layers in organic light-emitting diodes (OLEDs), flat screens and touch screens, antistatic films, printed circuits and capacitors, without being restricted thereto.

The copolymers according to the present invention can be used to produce optical, electronic and semiconductor materials, especially as charge transport materials in field-effect transistors (FETs), for example as components of integrated circuits (ICs), ID tags or TFTs. Alternatively, they can be used in organic light-emitting diodes (OLEDs) in electroluminescent displays or as backlighting, for example liquid-crystal displays (LCDs), in photovoltaic applications or for sensors, for electrophotographic recording and other semiconductor applications.

Since the copolymers according to the present invention have good solubility, they can be applied to the substrates as solutions. Layers can therefore be applied with inexpensive processes, for example spin-coating.

Suitable solvents or solvent mixtures comprise, for example, alkanes, aromatics, especially their fluorinated derivatives.

FETs and other components comprising semiconductor materials, for example diodes, can be used advantageously in ID tags or security labels in order to indicate authenticity and to prevent forgeries of valuable items such as banknotes, credit cards, identity documents such as ID cards or driving licenses or other documents with pecuniary advantage such as rubber stamps, postage stamps or tickets, etc.

Alternatively, the polymers according to the present invention can be used in organic light-emitting diodes (OLEDs), for example in displays or as backlighting for liquid-crystal displays (LCDs). Typically, OLEDs have a multilayer structure. A light-emitting layer is generally embedded between one or more electron- and/or hole-transporting layers. When an electrical voltage is applied, the electrons or holes can migrate in the direction of the emitting layer, where their recombination to the excitation and subsequent luminescence of the luminophoric compounds in the emitting layer. The polymers, materials and layers may, according to their electrical and optical properties, find use in one or more of the transport layers and/or emitting layers. When the compounds, materials or layers are electroluminescent or have electroluminescent groups or compounds, they are particularly suitable for the emitting layer.

Like the processing of suitable polymers for use in OLEDs, the selection is common knowledge and is described, for example, in Synthetic Materials, 111-112 (2000), 31 34 or J. Appl. Phys., 88 (2000) 7124-7128.

Various deposition techniques, including deposition from various solution processing techniques, have been used with organic semiconductors. For example, much of the printed electronics technology has focused on inkjet printing, primarily because this technique offers greater control over feature position and multilayer registration. Inkjet printing is a non-contact process, which offers the benefits of not requiring a preformed master (compared to contact printing techniques), as well as digital control of ink ejection, thereby providing drop-on-demand printing. Micro dispensing is another non-contact method of printing. However, contact printing techniques have the advantage of being well-suited for very fast roll-to-roll processing. Exemplary contact printing techniques include, but are not limited to, screen-printing, gravure printing, offset printing, flexographic printing, lithographic printing, pad printing, and microcontact printing. As used herein, "printing" includes a non-contact process such as inkjet printing, micro-dispensing and the like, and a contact process such as screen-printing, gravure printing, offset printing, flexographic printing, lithographic printing, pad printing, microcontact printing and the like. Other solution processing techniques include, for example, spin coating, drop-casting, zone casting, dip coating, blade coating, or spraying.

Various articles of manufacture including electronic devices, optical devices, and opto-electronic devices, such as field effect transistors (e.g., thin film transistors), photovoltaics, organic light emitting diodes (OLEDs), complementary metal oxide semiconductors (CMOSs), complementary inverters, D flip-flops, rectifiers, and ring oscillators, that make use of the compounds disclosed herein also are within the scope of the present teachings as are methods of making the same.

The present teachings, therefore, further provide methods of preparing a semiconductor material. The methods can include preparing a composition that includes one or more compounds disclosed herein dissolved or dispersed in a liquid medium such as solvent or a mixture of solvents, depositing the composition on a substrate to provide a semiconductor material precursor, and processing (e.g. heating) the semiconductor precursor to provide a semiconductor material (e.g. a thin film semiconductor) that includes a compound disclosed herein. In various embodiments, the liquid medium is an organic solvent, an inorganic solvent such as water, or combinations thereof. In some embodiments, the composition can further include one or more additives independently selected from detergents, dispersants, binding agents, compatiblizing agents, curing agents, initiators, humectants, antifoaming agents, wetting agents, pH modifiers, biocides, and bacteriostats. For example, surfactants and/or other polymers (e.g., polystyrene, polyethylene, poly-alpha-methylstyrene, polyisobutene, polypropylene, poly-methylmethacrylate, and the like can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone-casting, dip coating, blade coating, or spraying.

The present teachings further provide articles of manufacture such as the various devices described herein that include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., poly-carbonate, polyester, polystyrene, polyhaloethylene, poly-acrylate), and self-assembled superlattice/self-assembled nanodielectric (SAS/SAND) materials (e.g., described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. Patent Application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Other articles of manufacture in which materials of the present teachings are useful are photovoltaics or solar cells. Components of the present teachings can exhibit broad optical absorption and/or a very positively shifted reduction potential, making them desirable for such applications. Accordingly, the substances described herein can be used as a p-type semiconductor in a photovoltaic design, which includes an adjacent n-type semiconducting material that forms a p-n junction. The compounds can be in the form of a thin film semiconductor, which can be deposited on a substrate to form a composite. Exploitation of small molecules of the present teachings in such devices is within the knowledge of a skilled artisan. Since the present (co)polymers provide a low energy HOMO (highest occupied molecular orbital), the present materials possess especially valuable properties for the preparation of multiple junction polymer solar cells such as tandem cells (for the general set-up and function of multiple junction solar cells, and their preparation by solution polymer processing, see Jan Gilot et al., Appl. Phys. Lett. 90, 143512 (2007)).

Another aspect of the present teachings relates to methods of fabricating an organic field effect transistor that incorporates a semiconductor material of the pre-sent teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. An OFET can include a dielectric layer, a semiconductor layer, a gate contact, a substrate, source and drain contacts In certain embodiments, OTFT devices can be fabricated with the present compounds on doped silicon substrates, using SiO2 as the dielectric, in top-contact geometries. In particular embodiments, the active semiconducting layer which incorporates at least a material of the present teachings can be deposited at room temperature or at an elevated temperature. In other embodiments, the active semiconducting layer which incorporates at least a compound of the present teachings can be applied by spin-coating or printing as described herein. For top-contact devices, metallic contacts can be patterned on top of the films using shadow masks.

The polymers (I), more specifically described above as copolymers of the formula (I), are novel compounds and thus another embodiment of the present invention. Preferred embodiments of this class are (co)polymers es described for the present organic semiconductor material, layer or components.

General Methods

Monomers may be obtained according to methods known in the art.

For example, benzo[1,2-b;4,3-b']dithiophene can be made photochemically. For this reason, 2-carbonylthiophene may be reductively coupled in a McMurry reaction to yield E-dithienylethene. This molecule may be dibrominated by lithiation and treatment with tetrabromomethane. The dibromo intermediate thus obtained may be stored under argon at low temperatures. Benzo[1,2-b;4,5-b']dithiophene may be obtained on UV irradiation, e.g. at 350 nm, in a suitable solvent such as toluene and in the presence of oxygen. The cyclization is preferably carried out in presence of a catalytic amount of iodine. Irradiation time is preferably from hours (e.g. 1 or 2 hours) up to several days (e.g. 1 to 10 days). The procedure is summarized in the following scheme:

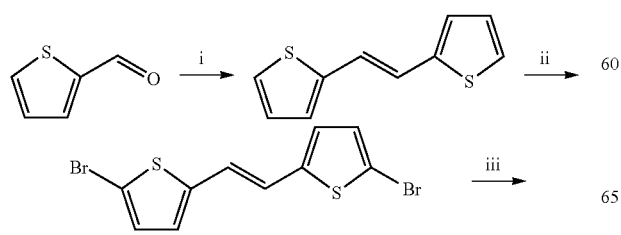

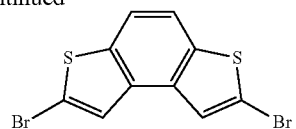

Benzo[1,2-b;3,4-b']dithiophene may be obtained in a similar manner from the required dithienylethene via photochemical cyclodehydrogenation. The required non-symmetric dithienylethene may be obtained in 3 steps from thiophene by chloromethylation with formaldehyde (i) preferably in presence of a protonic acid (e.g. in concentrated hydrochloric acid with additional HCl gas saturation). The chloromethylated intermediate may be collected by distillation. Triethylphosphite reacts with it (ii; Arbusov reaction) to give the phosphonate; best results are obtained when both reagents are heated, e.g. to 150° C., preferably without solvent. The product can be used without any purification.

Step (iii): A Wittig-Horner reaction with 3-carbonylthiophene is conducted in presence of a strong base like an alcoholate (e.g. potassium tert-butylate as base) to yield the E-dithienylethene in high selectivity. Photochemical cyclodehydrogenation is performed following the procedure given above for the isomeric benzodithiophene.

The procedure is summarized in the following scheme:

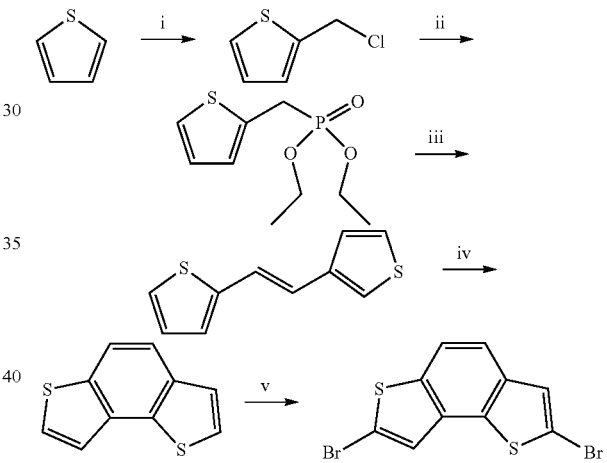

Likewise, preparation of analogous substituted monomers of the formula II' or III'

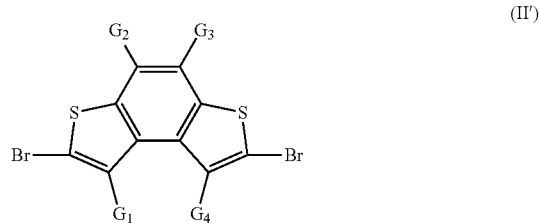

(II')

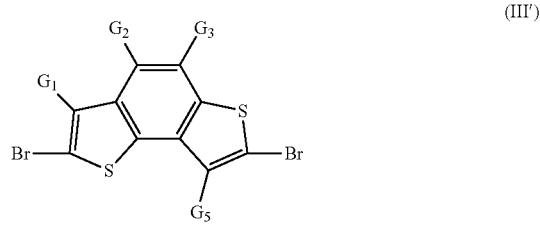

(III')

may be effected, for example, using appropriately substituted educts of structure analogous to those shown in the above schemes, but wherein at least one of $G_1$ to $G_5$ is different from hydrogen, in accordance with the definitions given above or in present claims.

The monomers thus obtained may be subjected to copolymerization as such, or may be reacted with further comonomers COM before conversion into the copolymer chain.

For example, monomers for an oxidative polymerization may be obtained in a Stille coupling from the above dibromobenzodithiophenes. For copolymer chains comprising the preferred thiophene units and/or diketopyrrolopyrrol (DPP) units as comonomers, the dibromo compounds may be reacted with the mono-stannated comonomer to obtain an aggregated unit. The coupling reaction follows methods well known in the art, for example, the dibromo monomer may be reacted with 2-trialkylstannylthiophene, which may be substituted by $R^{104}$, such as 2-tributylstannyl-3-dodecylthiophene, with the aid of a catalyst. An example is the reaction in presence of a catalytic amount of Pd(PPh3)4 in a solvent such as DMF, e.g. with heating to 30-120° C. The tin reagent may conveniently be dissolved in THF before adding to the mixture. The resulting aggregates may be purified, e.g. by chromatography and/or recrystallization (using solvents such as ethyl acetate), before the polymerization reaction in order to avoid defects in the polymer chain.

Copolymer preparation: The copolymers can be synthesized via across-coupling polymerisation reaction, such as Stille or Suzuki reaction, in which an aryl dihalide is reacted with a organotin compound or a boronic diester/acid in the presence of a base and a small amount of metal catalyst. Typically the reaction is carried out in a solvent or mixture of solvents with a reaction temperature between 20° C. and 150° C.

Synthesis by Stille polymerization proceeds e.g. with the corresponding bisstannylated benzodithiophene and an appropriate dibrominated comonomer Br-COM-Br such as dialkyl-dibromo-dithiophene, e.g. using a catalyst like Pd2(dba)3 and triphenylphosphine in a suitable solvent. Preferred solvents are aromatic and/or halogenated hydrocarbons such as benzene, toluene, xylene, as well as mono- or dichlorobenzene. Alternatively, oxidative polymerization may be effected by adding a solution of the monomer(s), especially highly concentrated (e.g. more than 20 mg/ml, especially 50 mg/ml or more), in an inert solvent (such as (di)chlorobenzene) to iron(III)chloride, preferably with heating to about 60° C. to avoid gelation. After the reaction, the polymers may be recovered in conventional manner, e.g. by precipitation in a non-solvent (such as an alcohol like methanol) and/or extraction (e.g. soxhlet extraction with acetone). The polymerization process is advantageously monitored by analyzing samples via chromatography (e.g. size exclusion chromatography in reference to polystyrene standards); it may be interrupted (e.g. by precipitation as described) in order to improve solubility properties of the material.

The present invention thus includes a process for the preparation of a polymer of formula

(II')

wherein -COM1- is as defined as COM, and A and -COM- are as defined in any of claims 1 to 10, comprising
reacting a dihalogenide of formula $X^{10}$-A-$X^{10}$ with an essentially equimolar amount of a diboronic acid or diboronate corresponding to formula, $X^{11}$—[COM$^1$]—$X^{11}$, or reacting a dihalogenide of formula $X^{10}$—[COM$^1$]—$X^{10}$ with an essentially equimolar amount of a diboronic acid or diboronate corresponding to formula $X^{11}$-A-$X^{11}$, wherein
$X^{10}$ is halogen, especially Br, and
$X^{11}$ is independently in each occurrence —B(OH)$_2$, —B(OY$^1$)$_2$,

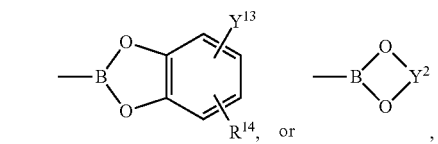

wherein $Y^1$ is independently in each occurrence a $C_1$-$C_{10}$alkyl group, and $Y^2$ is independently in each occurrence a $C_2$-$C_{10}$alkylene group, such as —CY$^3$Y$^4$—CY$^5$Y$^6$— or —CY$^7$Y$^8$—CY$^{11}$Y$^{12}$—, wherein $Y^3$, $Y_4$, $Y^5$, $Y^6$, $Y^7$, $Y^8$, $Y^{10}$, $Y^{11}$ and $Y^{12}$ are independently of each other hydrogen or $C_1$-$C_{10}$alkyl subject to the condition that the number of carbon atoms in the alkylene group —CY$^3$Y$^4$—CY$^5$Y$^6$— or —CY$^7$Y$^8$—CY$^9$Y$^{10}$—CY$^{11}$Y$^{12}$— does not exceed 10, especially preferred as $Y^2$ being —C(CH$_3$)$_2$C(CH$_3$)$_2$—, —C(CH$_3$)$_2$CH$_2$C(CH$_3$)$_2$—, —CH$_2$C(CH$_3$)$_2$CH$_2$—;
and $Y^{13}$ and $Y^{14}$ are independently of each other hydrogen or a $C_1$-$C_{10}$alkyl group, in a solvent and in the presence of a catalyst.

Further included is a process for the preparation of a polymer of formula

(II')

which process comprises reacting a dihalogenide of formula $X^{10}$-A-$X^{10}$ with an equimolar amount of an organo tin compound corresponding to formula $X^{11'}$—[COM$^1$]—$X^{11'}$, or reacting a dihalogenide of formula $X^{10}$—[COM$^1$]—$X^{10}$ with an equimolar amount of an organo tin compound corresponding to formula $X^{11'}$-A-$X^{11'}$, wherein
wherein A and -COM$^1$- and $X^{10}$ are as defined above,
$X^{11'}$ is independently in each occurrence —SnR$^{207}$R$^{208}$R$^{209}$, wherein R$^{207}$, R$^{208}$ and R$^{209}$ are identical or different and are H or $C_1$-$C_6$alkyl, or two of the groups R$^{207}$, R$^{208}$ and R$^{209}$ form a ring and these groups are optionally branched.

Essential for the synthesis of high molecular weight polymer is the high purity and therefore an appropriate purification method of the utilized monomers. The purity of the monomers (i.e. the 5,5'-dihalo-2,2'-dithiophene and the 5,5'-bis(trialkyl)benzo-thiophene) is in general >99%. A high purity of the 5,5'-bis(trimethylstannyl)benzo-2,2'-dithiophen can be obtained by repeated recrystallisation (preferably at least three time) at low temperature from acetonitrile. This purification yields the monomer in the form of colorless needles.

The 4,4'-alkyl-5,5'-dibromo-2,2'-dithiophene monomer can be obtained with very high purity by purification by column chromatography (n-hexane, Silica) followed by repeated recrystallisation from ethylacetate.

The use of monomers with a significantly lower purity than 99% leads to a polymer of much lower molecular weight.

The second important factor is the adjustment of the monomer ratio. An equimolar mixture yields the desired molecular weight.

The molecular weight can be reproducibly obtained by adjusting the concentration of the 1:1 monomer mixture. In order to obtain a high number average molecular weight of 15-20 kg/mol, the optimum, total concentration of the monomers is in the range of from 10 to 20 wt %.

The invention comprises both the oxidized and the reduced forms of the polymers according to the present invention. Either a deficiency or an excess of electrons leads to the formation of a delocalized ion which has a high conductivity. This can be done by doping with customary dopants. Dopants and doping processes are common knowledge and are known, for example, from EP-A 0 528 662, U.S. Pat. No. 5,198,153 or WO 96/21659. Suitable doping processes comprise, for example, doping with a doping gas, electrochemical doping in a solution comprising the dopant, by thermal diffusion and by ion implantation of the dopant into the semiconductor material.

In the case of use of electrons as charge carriers, preference is given to using halogens (e.g. I2, Cl2, Br2, ICl, ICl3, IBr and IF), Lewis acids (e.g. PF5, AsF5, SbF5, BF3, BCl3, SbCl5, BBr3 and SO3), inorganic acids (e.g. HF, HCl, HNO3, H2SO4, HClO4, FSO3H and ClSO3H), organic acids or amino acids, transition metal compounds (e.g. FeCl3, FeOCl, Fe(ClO4)3, Fe(4-CH3C6H4SO3)3, TiCl4, ZrCl4, HfCl4, NbF5, NbCl5, TaCl5, MoF5, MoCl5, WF5, WCl6, UF6 and LnCl3 (where Ln is a lanthanoid)), anions (e.g. Cl—, Br—, I—, I3-, HSO4-, SO42-, NO3-, ClO4-, BF4-, PF6-, AsF6-, SbF6-, FeCl4-, Fe(CN)63-, and anions of different sulfonic acids such as aryl-SO3-). In the case of use of holes as charge carriers, as dopants, for example, are cations (e.g. $H^+$, $Li^+$, $Na^+$, $K^+$, $Rb^+$ and $Cs^+$), alkali metals (e.g. Li, Na, K, Rb, and Cs), alkaline earth metals (e.g. Ca, Sr and Ba), O2, XeOF4, ($NO2^+$)(SbF6-), ($NO2^+$)(SbCl6-), ($NO2^+$)(BF4-), AgClO4, H2IrCl6, La(NO3)3, FSO2OOSO2F, Eu, acetylcholine, $R4N^+$, $R4P^+$, $R6As^+$ and $R3S^+$, where R is an alkyl group.

Chemicals and Solvents: All used chemicals and solvents are obtained from the companies ABCR, Acros, Aldrich, Alpha-Aesar, Fluka, Lancaster, Merck and Strem. Unless otherwise mentioned, they are used as obtained.

Chromatography: Preparative column chromatography is performed on silica gel from Merck with a grain size of 63-200 μm (silica gel) or 40-63 μm (flash silica gel, Geduran Si 60). For analytical thin layer chromatography (TLC), silica gel coated substrates "60 F254" from Merck are used. Compounds are detected by fluorescence quenching at 254 nm, self-fluorescence at 366 nm or staining in an iodine vapor chamber. For eluents, analytically pure solvents (p.a. or technical grade) are distilled prior to the use.

Inert Atmosphere: Oxygen or moisture sensitive reactions are carried out in an argon atmosphere (Westfalen AG). If not mentioned specifically, reactions are degassed by bubbling a stream of argon through the reaction mixture.

UV reactions: UV reactions are done in a Rayonet RPR-100 with up to eight lamps (20 W each) of either 300 or 350 nm as indicated. The lamps possess a half width wavelength distribution of 40 nm. The apparatus is cooled by a 15 W air fan. Quartz glassware is used as reaction vessel, the solution is stirred by a magnetic stir bar.

Melting Points: Melting points are determined on a Buchi hot stage apparatus and are uncorrected.

Mass Spectrometry: Field-desorption mass spectra are obtained on a VG Instruments ZAB 2-SE-FPD spectrometer. MALDI-TOF spectrometry is conducted on a Bruker Reflex IITOF spectrometer, utilizing a 337 nm nitrogen laser. If not specifically mentioned, tetracyanoquinodimethane (TCNQ) is used as the matrix substance for solid state prepared samples. Varying thicknesses of the prepared sample on the MALDI target reduced the resolution; therefore only integers of the molecular peaks are given. The most intense peak is compared to the calculated isotope of highest abundance.

NMR Spectroscopy: 1H-NMR, 13C-NMR, H,H-COSY, C,H-COSY and NOESY experiments are recorded in the listed deuterated solvents on a Bruker DPX 250, Bruker AMX 300, Bruker DRX 500 or a Bruker DRX 700 spectrometer. The deuterated solvent is used as an internal standard, CD2Cl2 is set to δH=5.32 ppm and δC=54.00 ppm, THF to δH=3.58 ppm and δC=67.57 ppm, DMSO to δH=2.50 ppm and δC=39.51 ppm, C2D2Cl4 to δH=5.91 ppm and δC=74.20 ppm.

Elemental Analysis: Elemental analysis of solid samples is carried out on a Foss Heraeus Vario EL as a service of the Institute for Organic Chemistry, Johannes Gutenberg—Universität of Mainz. Liquid compounds or oils are not analyzed because of the difficulties to remove residual solvents and atmospheric gases like CO2. Halogen containing molecules evolve hydrohalogenic acids on burning such that for each halogen atom one hydrogen atom escapes the measurement. The theoretical values are corrected accordingly, a note is given when doing so.

UV-vis Spectroscopy: Solution UV-vis spectra are recorded at room temperature on a Perkin-Elmer Lambda 100 spectrophotometer. The molar extinctions are given in the unit $m^2 mol^{-1}$ which is consistent with the SI standard. Unless otherwise noted, a concentration of 10-5 mol/l is used. Solvents of spectroscopic grade are employed. The baseline is corrected by substracting a measurement of the cuvette filled with pure solvent used for the measurement. Solution photoluminescence spectra are recorded on a SPEX-Fluorolog II (212) spectrometer. Quantum yields of selected compounds are calculated by comparing to the known standard 5,10-diphenylanthrabene (three different concentrations). Unless otherwise stated, the measurement is performed at room temperature.

Infrared Spectroscopy: Infrared spectroscopy is measured on a Nicolet 730 FT-IR spectrometer in the evanscence field of a diamond. The sample is deposited as pristine material on the diamond crystal and pressed on it with a stamp. 64 measurements are recorded for each sample, the background is substracted.

Cyclic Voltammetry: Cyclic volatammetry is measured on a Princeton Applied Research Parstat 2273 instrument with anhydrous solvents under argon atmosphere. Tetrabutylammoniumperchlorate is used as conductive salt at a concentration of 0.1 mol/l. Ferrocen is added as internal standard (1 mM). A platinum working electrode (0.5 mm diameter), a platinum wire as counter electrode, and a silver wire as quasi-reference electrode are used. The peaks are calibrated according to the oxidation peak of ferrocene. Half-step potentials are used for the evaluation.

Field-Effect Transistors: Standard procedure for transistors on silicon substrates: Heavily doped silicon wafers with a 200 nm thick thermally grown silicon dioxide layer are used as substrates. Hexamethyldisilazane is deposited out of the gas phase at 120° C. The semiconductor polymeric film is prepared by spin-coating (3000 rpm, 60 s) a 5 mg/ml 1,2-dichlorobenzene solution (roughly 47.5 nm thick). After annealing the substrate at 100° C. for 5 min and slow cooling (1° C./min), source and drain electrodes are fabricated by vapor-depositing gold ($3 \cdot 10^{-6}$ mbar, 1 Å/s, ~100 nm thick) onto the semiconductor thin films through a shadow mask to obtain devices with channel lengths of between 25-75 μm and of widths about 0.5 to 1.5 mm (W/L=20). All preparations and electrical measurements using a Keithley 4200 semiconductor parameter analyzer are performed under nitrogen atmosphere in yellow light The charge carrier mobility is calculated in saturation from the equation $$\mu_{sat} = \frac{2I_{SD}L}{WC_i(V_{SG}-V_{th})^2}$$

PET substrates: Gold electrodes are evaporated onto an FET foil (roughly 35 nm thick). A solution (2 mg/ml) of the polymer in chlorobenzene is spin-cast at 90° C. onto the substrate and dried for 30 seconds at 100° C. Polystyrene (MW=820 kg/mol, BASF) is spin-cast on top from a 5.5 weight-percent solution in ethyl acetate. The gate contact is made by evaporating a layer of about 50 nm of gold on top by the aid of a shadow mask. Measurements are performed using a Keithley 4200 machine under ambient conditions in the absence of light. Gate-dependent mobility is calculated according to $$\frac{dI_{SD}}{dV_G} = \frac{W}{L}\mu_{sat}C_iV_{SD}$$

X-ray scattering: The two-dimensional wide-angle X-ray diffraction experiments are performed by means of a rotating anode (Rigaku 18 kW) X-ray beam with a pinhole collimation and a 2D Siemens detector with a beam diameter of ca 1 mm. A double graphite monochromator for the Cu—Kα radiation (λ=0.154 nm) is used.

Film X-ray diffraction is performed on a theta-theta Philips PW 1820 Kristalloflex diffractometer with a graphite-monochromized Cu—Kα X-ray beam hitting a drop-cast film on a silicon wafer. The diffraction patterns are recorded in the 2 θ range from 1° to 32°.

Polarized Optical Microscopy: A Zeiss microscope equipped with polarizing filters and equipped with a Hitachi KPD50 Colour digital CCD camera is used in order to investigate the optical textures of the compounds. The samples are sandwiched between two glass slides and then thermally treated on a Linkam hotstage fitted with a Linkam TMS 91 temperature controller.

Differential Scanning Calorimetry: Differential scanning calorimetry (DSC) is measured on a Mettler DSC 30 with heating and cooling rates of 10 K/min.

Atomic force microscopy is performed by using a Nanoscope IIIa MultiMode scanning probe microscope; Digital Instruments, Santa Barbara, Calif.

The following examples are included for illustrative purposes only and are not to be construed to limit the scope of the claims. Unless otherwise stated, all parts and percentages are by weight. Over night denotes a time period from about 12 to 15 hours; room temperature denotes a temperature range 18-23° C.; similarly ambient conditions, which also imply atmospheric pressure. Abbreviations:

NBS N-bromosuccinimide
LDA Lithium diisopropylamide
THF tetrahydrofuran
TBME tert-butyl methylether
AIBN 2,2'-azobisisobutyronitrile
Mn molecular weight (number average)
Mw molecular weight (weight average)
PDI polydispersity

EXAMPLE 1

5,5'-Dibromobenzo[1,2-b;4,3-b']dithiophene

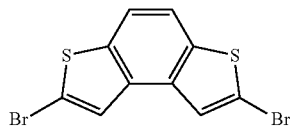

350 mg (1 mmol) Trans-di(5-bromthiophene-2-yl)ethene are dissolved in 200 ml toluene. About 2 mg (~10 μmol) iodine are added. The solution is irradiated with UV light (350 nm, 160 W) overnight while stirring rigorously in air. The solution is extracted with an aqueous solution of sodium sulfite, dried, and the solvent is evaporated. The residue is crystallized from ethanol to yield 300 mg (86%) of colorless needles. Mp=160° C.; MS (FD, 8 kV) m/z=348.5 g/mol—calculated: 347.8 g/mol for C10H4Br2S2; 1H-NMR (250 MHz, CD2Cl2, RT, δ in ppm) 7.65 (s, 2H), 7.61 (s, 2H); 13C-NMR (62.5 MHz, CD2Cl2, RT, δ in ppm) 138.6, 133.9, 125.2, 118.6, 116.2; elemental analysis: found 34.59% C, 0.50% H, 18.41% S—calculated: 34.51% C, 0.58% H (HBr loss), 18.42% S.

EXAMPLE 2

5,5'-Di(3-dodecylthiophene-2-yl-)benzo[1,2-b;4,3-b']dithiophene

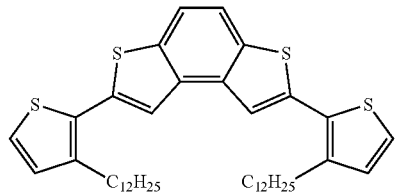

209 mg (0.6 mmol) 5,5'-Dibromobenzo[1,2-b;4,3-b'] dithiophene are dissolved in 10 ml anhydrous DMF under argon. A solution of 810 mg (2.5 mmol) 3-dodecyl-2-tributylstannylthiophene in 5 ml anhydrous THF and, finally, 30 mg (30 μmol) tetrakis(triphenylphosphine)palladium(0) are added. The resulting solution is heated to 100° C. overnight. The solvents are removed in vacuum, the residue is adsorbed on silica gel and eluted with a mixture of petroleum ether and dichloromethane (20:1 v/v). Crystallization from ethyl acetate yields 155 mg (37%) of a yellow powder. Mp=84° C.; MS (FD, 8 kV) m/z=690.6 g/mol—calculated: 690.3 g/mol for C42H58S4; 1H-NMR (300 MHz, CD2Cl2, RT, δ in ppm) 7.75 (s, 2H), 7.71 (s, 2H), 7.29 (d, J=5.2 Hz, 2H), 7.02 (d, J=5.2 Hz, 2H), 2.88 (t, J=7.8 Hz, 4H), 1.69 (quin, J=7.6 Hz, 4H), 1.4-1.2 (m, 36H), 0.87 (t, J=6.7 Hz, 6H);

13C-NMR (75 MHz, THF-d8, RT, δ in ppm) 141.7, 138.0, 137.9, 135.9, 131.6 131.2, 126.0, 121.6, 119.3, 33.1, 31.9, 30.80, 30.76 (multiple peaks), 30.6, 30.5, 30.3, 23.7, 14.6; elemental analysis: found 73.10% C, 8.27% H, 18.50% S—calculated: 72.99% C, 8.46% H, 18.56% S.

EXAMPLE 3

Poly(5,5'-di(3-dodecylthiophene-2-yl-)benzo[1,2-b;4,3-b']dithiophene)

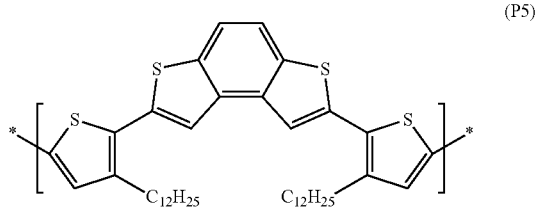

(P5)

69 mg (1 mmol) 5,5'-Di(3-dodecylthiophene-2-yl-)benzo[1,2-b;4,3-b']dithiophene are dissolved in 1 ml anhydrous dichlorobenzene under argon and added to a suspension of 65 mg (4 mmol) anhydrous iron(III) chloride in dichlorobenzene. The mixture is heated to 60° C. for 24 hours whereupon it is poured into methanol. The solid precipitate is filtered off, dissolved in dichlorobenzene, and added to methanol. The addition of a few drops of hydrazine (98%) induces precipitation. The solid is obtained by filtration, dissolved in dichlorobenzene, hydrazine is added, and stirred for 24 hours at room temperature. The polymer is precipitated in methanol, filtered, and dried in vacuum to afford 62 mg of a yellow-red solid (90%). GPC (1,2,4-trichlorobenzene, 135° C., polystyrene standards): Mn=26 kg/mol, Mw=72 kg/mol; 1H-NMR (500 MHz, o-dichlorobenzene-d4, 100° C., δ in ppm) 8.16 (s, 2H), 7.55 (s, 2H), 7.19 (s, 2H), 3.06 (br, 4H), 1.92 (br, 4H), 1.62 (br, 4H), 1.51 (br, 4H), 1.4-1.2 (m, 28H), 0.97 (br, 6H).

Polymer P5 readily dissolves in toluene, forming a stable solution even at room temperature.

EXAMPLE 4

5,5'-Dibromobenzo[1,2-b;3,4-b']dithiophene

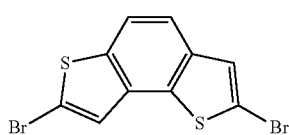 [SMILES: Brc1cc2c(ccc3cc(Br)sc32)s1]

570 mg (3 mmol) Benzo[1,2-b;3,4-b']dithiophene are dissolved in 50 ml anhydrous THF under argon and cooled to −78° C. 4.7 ml (7.5 mmol, 3 eq) t-butyllithium (1.6 M in pentane) are added. The solution is stirred for one hour in the cold bath. After this period, a solution of 2.49 g (7.5 mmol) tetrabromomethane in 5 ml anhydrous THF are added, and stirred for 30 minutes in the cold bath. 10 ml of a concentrated sodium bicarbonate solution are added at −78° C. After warming to room temperature, the solution is extracted with 100 ml diethyl ether, washed with water, dried, and the solvents are evaporated. The crude product is adsorbed on silica gel and eluted with petroleum ether. The product is crystallized from ethanol to give 300 mg (29%) of colorless needles. Mp=128° C.; MS (FD, 8 kV) m/z=348.2 g/mol—calculated: 347.8 g/mol for C10H4Br2S2; 1H-NMR (300 MHz, CD2Cl2, RT, δ in ppm) 8.70 (d, J=7.6 Hz, 1H), 8.59 (d, J=7.6 Hz, 1H), 7.46 (s, 1H), 7.43 (s, 1H); 13C-NMR (75 MHz, CD2Cl2, RT, δ in ppm) 138.2, 137.6, 134.9, 133.1, 128.0, 124.7, 120.0, 119.1, 117.1, 114.0; elemental analysis: found 34.66% C, 0.56% H, 18.41% S—calculated: 34.51% C, 0.58% H (HBr loss), 18.42% S

EXAMPLE 5

5,5'-Di(3-dodecylthiophene-2-yl-)benzo[1,2-b;3,4-b']dithiophene

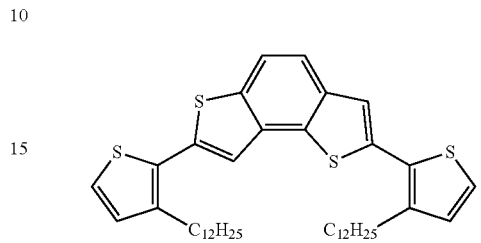

245 mg (0.7 mmol) 5,5'-Dibromobenzo[1,2-b;3,4-b']dithiophene and 1.1 g (2 mmol) 3-dodecyl-2-tributylstannylthiophene are dissolved in 10 ml anhydrous DMF under argon. 50 mg (50 μmol) Tetrakis(triphenylphosphine)palladium(0) are added. The resulting solution is heated to 110° C. overnight. The solvents are removed in vacuum, the residue is adsorbed on silica gel and eluted with a mixture of petroleum ether and dichloromethane (20:1 v/v). Crystallization from ethyl acetate yields 170 mg (35%) of a beige powder. Mp=54° C.; MS (FD, 8 kV) m/z=690.5 g/mol—calculated: 690.3 g/mol for C42H58S4; 1H-NMR (300 MHz, CD2Cl2, RT, δ in ppm) 7.78 (d, J=8.4 Hz, 1H), 7.71 (d, J=8.5 Hz, 1H), 7.55 (s, 1H), 7.45 (s, 1H), 7.30 (d, J=5.3 Hz, 1H), 7.28 (d, J=5.3 Hz, 1H), 7.02 (d, J=5.2 Hz, 2H), 2.89 (t, J=7.8 Hz, 2H), 2.88 (t, J=7.8 Hz, 2H), 1.69 (m, 4H), 1.4-1.2 (m, 36H), 0.87 (t, J=6.9 Hz, 6H); 13C-NMR (75 MHz, THF-d8, RT, δ in ppm) 141.6, 141.3, 138.4, 138.3, 137.9, 137.7, 136.6, 135.3, 133.8, 130.8, 130.7, 130.6, 125.3, 125.0, 123.4, 120.4, 119.9, 119.2; elemental analysis: found 72.99% C, 8.45% H, 18.38% S—calculated: 72.99% C, 8.46% H, 18.56% S

EXAMPLE 6

Poly(5,5'-di(3-dodecylthiophene-2-yl-)benzo[1,2-b;3,4-b']dithiophene)

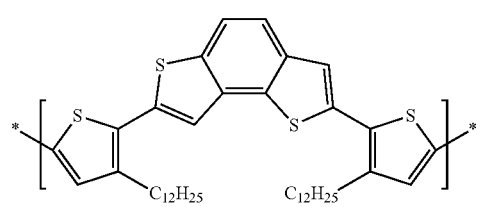

(P4)

50 mg (0.7 mmol) 5,5'-Di(3-dodecylthiophene-2-yl-)benzo[1,2-b;3,4-b']dithiophene are dissolved in 1 ml anhydrous dichlorobenzene under argon and added to of 47 mg (2.9 mmol) anhydrous iron(III) chloride in dichlorobenzene. The mixture is heated to 60° C. for 8 hours whereupon it is poured into methanol. The solid precipitate is filtered off, dissolved in dichlorobenzene, and added to methanol. The addition of a few drops of hydrazine (98%) induces precipitation. The solid is obtained by filtration, dissolved in dichlorobenzene, hydrazine is added, and stirred for 24 hours at room temperature. The polymer is precipitated in methanol, filtered, and dried in vacuum to afford 41 mg of a red solid (82%). GPC (1,2,4-trichlorobenzene, 135° C., polystyrene standards): Mn=17 kg/mol, Mw=88 kg/mol The following examples 7 to 12 show some alternative methods for the preparation of the present (co)polymers and intermediates:

EXAMPLE 7:

a) 5,5'-Bis(trimethylstannyl)-benzo[1,2-b;4,3-b']dithiophene (2)

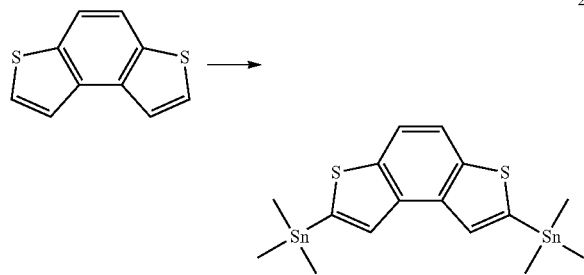

500 mg (2.6 mmol) benzo[1,2-b;4,3-b']dithiophene (1) are dissolved in 20 anhydrous THF under argon. The solution is cooled to −78° C. 4.9 ml (7.8 mmol, 3 eq) of a 1.6 M n-butyllithium solution in hexanes are added. The resulting mixture is stirred for two hours at −78° C., whereupon 2 g (10 mmol) of trimethyltin chloride are added at once as a solid. The reaction mixture is warmed to room temperature, poured onto aqueous sodium bicarbonate solution, extracted with diethyl ether, and dried. After evaporation of the solvent, the residue is crystallized three times with acetonitrile at 4° C. to yield 530 mg (40%) of colorless crystals. Mp=135° C.; MS (FD, 8 kV) m/z=514.9 g/mol—calculated: 515.9 g/mol for $C_{16}H_{22}S_2Sn_2$ $^1$H-NMR (250 MHz, $CD_2Cl_2$, RT): δ 7.87 (s, 2H), 7.78 (s, 2H), 0.47 (s, 18H); $^{13}$C-NMR (62.5 MHz, $CD_2Cl_2$, RT): δ 141.5, 141.2, 136.0, 130.4, 118.0, −8.0; elemental analysis: found 37.25% C, 4.16% H, 12.15% S—calculated: 37.25% C, 4.30% H, 12.43 % S b) Poly(5,5'-di(3-dodecylthiophene-2-yl-)benzo[1,2-b;4,3-b']dithiophene) (4)

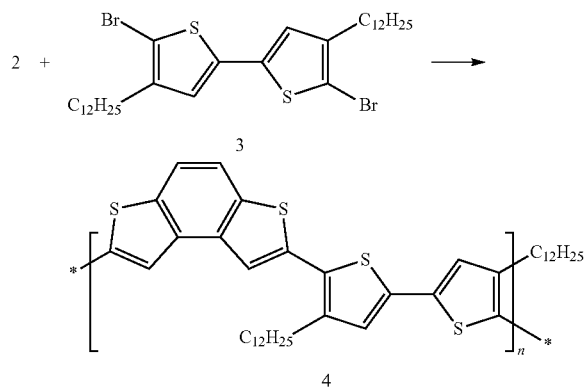

3.17 mg (0.2 mmol) 5,5'-bis(trimethylstannyl)benzo[1,2-b;4,3-b']dithiophene (2) and 132.14 mg (0.2 mmol) 4,4'-di-dodecyl-5,5'-dibromo-2,2'-dithiophene (3) are dissolved in 2 ml anhydrous 1,2-dichlorobenzene under argon. 5 mg (16 μmol) tri-o-tolylphosphine and 4 mg (4 μmol) Pd2(dba)3 are added. The resulting mixture is heated to 140° C. for three days. The solution is diluted with 1,2-dichlorobenzene and precipitated in methanol. After filtration the polymer is reprecipitated twice in methanol and dried. 100 mg of a red solid is obtained (73%). GPC (1,2,4-trichlorobenzene, 135° C.) analysis gives $M_n$=12 kg/mol and $M_w$=25 kg/mol against polystyrene standard. $^1$H-NMR (500 MHz, 1,2-dichlorobenzene-$d_4$, 100° C.): 8.16 (s, 2H), 7.55 (s, 2H), 7.19 (s, 2H), 3.06 (br, 4H), 1.92 (br, 4H), 1.62 (br, 4H), 151 (br, 4H), 1.4-1.2 (m, 28H), 0.97 (br, 6H)

EXAMPLE 8 a) 5,5'-Bis(trimethylstannyl)-benzo[1,2-b;3,4-b']dithiophene (6)

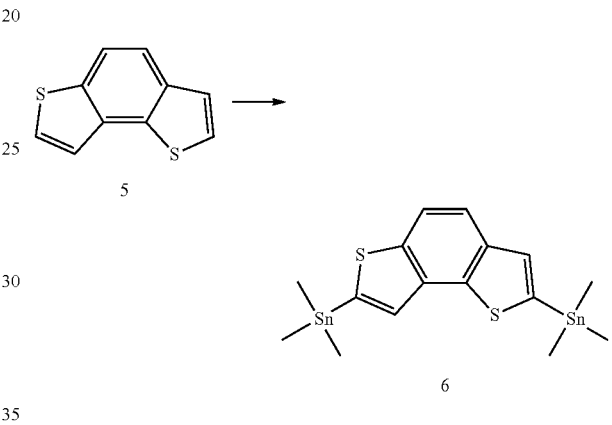

260 mg (1.37 mmol) benzo[1,2-b;3,4-b']dithiophene (5) are dissolved in 10 ml anhydrous THF under argon and cooled to −78° C. A 1.6M solution of t-butyllithium (2.6 ml, 4.2 mmol) is added and stirred for two hours. After this period, 820 mg (4.2 mmol) trimethyltin chloride are added as solid. The solution is warmed to room temperature, diluted with diethyl ether, extracted with aqueous sodium bicarbonate solution, dried and evaporated. The residual oil is dissolved in acetonitrile and subject to filtration on RP-18 silica gel. The first fractions are collected, evaporated. The residue is crystallized twice at −20° C. from acetonitrile to give 96 mg (14%) of colorless needles. Mp=58° C.; MS (FD, 8 kV) m/z=515.2 g/mol—calculated: 515.9 g/mol for $C_{16}H_{22}S_2Sn_2$; $^1$H-NMR (300 MHz, $CD_2Cl_2$, RT): δ 7.81 (dd, 1H, $J_1$=8.5 Hz, $J_2$=0.8 Hz), 7.71 (d, 1H, J=8.5 Hz), 7.67 (d, 1H, J=0.8 Hz), 7.54 (s, 1H), 0.46 (s, 9H), 0.45 (s, 9H); $^{13}$C-NMR (62.5 MHz, $CD_2Cl_2$, RT): δ 142.2, 141.2 139.0, 138.2, 135.3, 133.3, 130.3, 119.4, 118.7, −8.01, −8.04; elemental analysis: found 37.35% C, 4.25% H, 12.37% S—calculated: 37.25% C, 4.30% H, 12.43% S b) Poly(5,5'-bis(3-dodecylthiophen-2-yl)-benzo[1,2-b;3,4-b']dithiophene) (7)

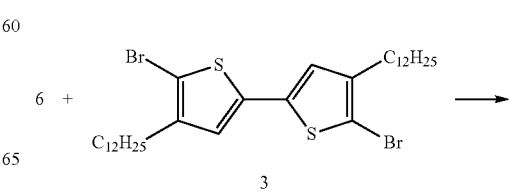

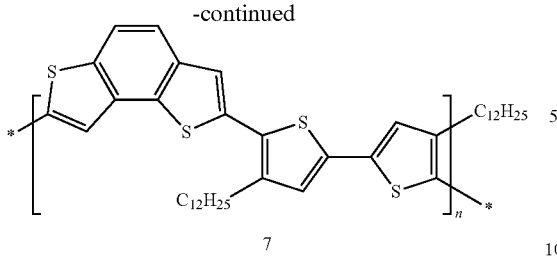

A microwave tube is charged with 51.59 mg (0.1 mmol) 5,5'-Bis(trimethylstannyl)-benzo[1,2-b;3,4-b']dithiophene (6) and 66.07 (0.1 mmol) 4,4'-didodecyl-5,5'-dibromo-2,2dithiophene (3). In the glovebox, 5 mg (5 μmol) tetrakis(triphenylphosphine)palladium(0), 1 ml anhydrous toluene and 0.1 ml anhydrous DMF are added. The tube is sealed and irradiated with 300 W microwaves: 5 minutes at 120° C., 5 min at 140° C., and finally 40 min at 170° C. The resulting mixture is dissolved in warm chlorobenzene, precipitated in methanol, and subject to soxhlet extraction with acetone for 12 hours. 63 mg of a red-orange solid are obtained (91%). GPC (1,2,4-trichlorobenzene, 135° C.) analysis gives $M_n$=11 kg/mol and $M_w$=25 kg/mol against polystyrene standard. $^1$H-NMR (500 MHz, 120° C., 1,2,-dichlorobenzene-$d_4$; δ in ppm) 7.87 (br, 1H), 7.83 (br, 2H), 7.69 (br, 1H), 7.39 (br, 2H), 3.17 (br, 4H), 2.03 (br, 4H), 1.72 (br, 4H), 1.62 (br, 4H), 1.6-1.4 (m, 28H), δ 1.07 (br, 6H)

EXAMPLE 9

5,5'-Dibromobenzo[1,2-b;3,4-b']dithiophene (8)

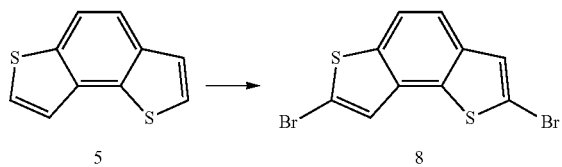 [SMILES: c1cc2c(ccc3ccsc32)s1 ; Brc1cc2c(ccc3cc(Br)sc32)s1]

570 mg (3 mmol) benzo[1,2-b;3,4-b']dithiophene (5) are dissolved in 50 ml anhydrous THF under argon and cooled to −78° C. 4.7 ml (7.5 mmol, 3 eq) t-butyllithium (1.6 M in pentane) are added. The solution is stirred for one hour in the cold bath. After this period, a solution of 2.49 g (7.5 mmol) tetrabromomethane in 5 ml anhydrous THF are added, stirred for 30 minutes in the cold bath. 10 ml of a concentrated sodium bicarbonate solution are added at −78° C. After warming to room temperature, the solution is extracted with 100 ml diethyl ether, washed with water, dried, the solvents are evaporated. The crude product is adsorbed on silica gel and eluted with petroleum ether. The product is crystallized from ethanol to give 300 mg (29%) of colorless needles. Mp=128° C.; MS (FD, 8 kV) m/z=348.2 g/mol—calculated: 347.8 g/mol for $C_{10}H_4Br_2S_2$; $^1$H-NMR (300 MHz, $CD_2Cl_2$, RT, δ in ppm) 8.70 (d, J=7.6 Hz, 1H), 8.59 (d, J=7.6 Hz, 1H), 7.46 (s, 1H), 7.43 (s, 1H); $^{13}$C-NMR (75 MHz, $CD2Cl_2$, RT, δ in ppm) 138.2, 137.6, 134.9, 133.1, 128.0, 124.7, 120.0, 119.1, 117.1, 114.0; elemental analysis: found 34.66% C, 0.56% H, 18.41% S—calculated: 34.51% C, 0.58% H (HBr loss), 18.42% S

EXAMPLE 10

5,5'-Di(3-dodecylthiophene-2-yl-)benzo[1,2-b;3,4-b']dithiophene (10)

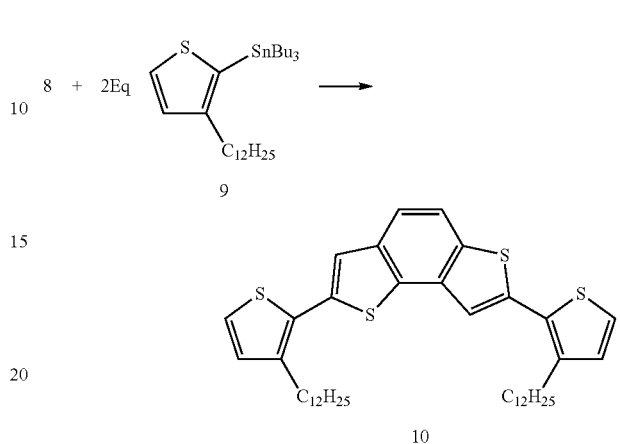

245 mg (0.7 mmol) 5,5'-dibromobenzo[1,2-b;3,4-b']dithiophene (8) and 1.1 g (2 mmol) 3-dodecyl-2-tributylstannylthiophene (9) are dissolved in 10 ml anhydrous DMF under argon. 50 mg (50 μmol) tetrakis(triphenylphosphine)palladium(0) are added. The resulting solution is heated to 110° C. overnight. The solvents are removed in vacuum; the residue is adsorbed on silica gel and eluted with a mixture of petroleum ether and dichloromethane (20:1 v/v). Crystallization from ethyl acetate yields 170 mg (35%) of a beige powder. Mp=54° C.; MS (FD, 8 kV) m/z=690.5 g/mol—calculated: 690.3 g/mol for $C_{42}H_{58}S_4$; $^1$H-NMR (300 MHz, $CD_2Cl2$, RT, δ in ppm) 7.78 (d, J=8.4 Hz, 1H), 7.71 (d, J=8.5 Hz, 1H), 7.55 (s, 1H), 7.45 (s, 1H), 7.30 (d, J=5.3 Hz, 1H), 7.28 (d, J=5.3 Hz, 1H), 7.02 (d, J=5.2 Hz, 2H), 2.89 (t, J=7.8 Hz, 2H), 2.88 (t, J=7.8 Hz, 2H), 1.69 (m, 4H), 1.4-1.2 (m, 36H), 0.87 (t, J=6.9 Hz, 6H); $^{13}$C-NMR (75 MHz, THF-$d_8$, RT, δ in ppm) 141.6, 141.3, 138.4, 138.3, 137.9, 137.7, 136.6, 135.3, 133.8, 130.8, 130.7, 130.6, 125.3, 125.0, 123.4, 120.4, 119.9, 119.2; elemental analysis: found 72.99% C, 8.45% H, 18.38% S—calculated: 72.99% C, 8.46% H, 18.56% S

EXAMPLE 11

5,5'-Dibromobenzo[1,2-b;4,3-b']dithiophene (12)

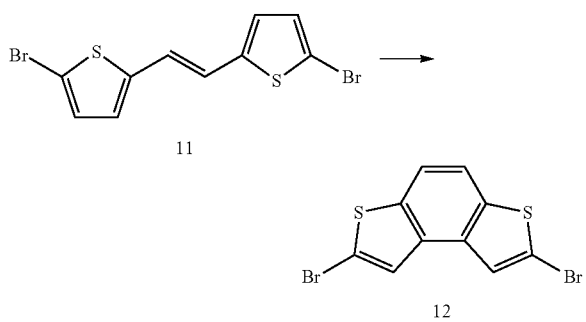

350 mg (1 mmol) trans-di(5-bromthiophene-2-yl)ethane (11) are dissolved in 200 ml toluene. About 2 mg (~10 μmol) iodine are added. The solution is irradiated with UV light (350 nm, 160 W) overnight while stirring rigorously in air. The solution is extracted with an aqueous solution of sodium sulfite, dried, the solvent is evaporated. The residue is crystallized from ethanol to yield 300 mg (86%) of colorless needles. Mp=160° C.; MS (FD, 8 kV) m/z=348.5 g/mol—calculated: 347.8 g/mol for $C_{10}H_4Br_2S_2$; $^1$H-NMR (250 MHz, $CD_2Cl_2$, RT, δ in ppm) 7.65 (s, 2H), 7.61 (s, 2H); $^{13}$C-NMR (62.5 MHz, $CD_2Cl_2$, RT, δ in ppm) 138.6, 133.9, 125.2, 118.6, 116.2; elemental analysis: found 34.59% C, 0.50% H, 18.41% S—calculated: 34.51% C, 1.16% H (0.58% H with HBr loss), 18.42% S

EXAMPLE 12

5,5'-Di(3-dodecylthiophene-2-yl-)benzo[1,2-b;4,3-b'] dithiophene (13)

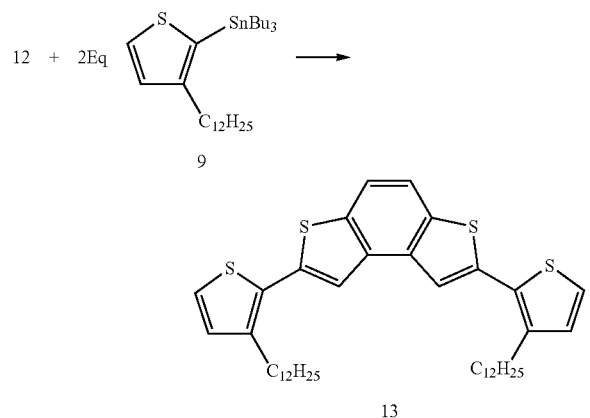

209 mg (0.6 mmol) 5,5'-dibromobenzo[1,2-b;4,3-b'] dithiophene (12) are dissolved in 10 ml anhydrous DMF under argon. A solution of 810 mg (2.5 mmol) 3-dodecyl-2-tributylstannylthiophene (9) in 5 ml anhydrous THF and, finally, 30 mg (30 μmol) tetrakis(triphenylphosphine)palladium(0) are added. The resulting solution is heated to 100° C. overnight. The solvents are removed in vacuum, the residue is adsorbed on silica gel and eluted with a mixture of petroleum ether and dichloromethane (20:1 v/v). Crystallization from ethyl acetate yields 155 mg (37%) of a yellow powder. Mp=84° C.; MS (FD, 8 kV) m/z=690.6 g/mol—calculated: 690.3 g/mol for $C_{42}H_{58}S_4$; $^1$H-NMR (300 MHz, $CD_2Cl_2$, RT, δ in ppm) 7.75 (s, 2H), 7.71 (s, 2H), 7.29 (d, J=5.2 Hz, 2H), 7.02 (d, J=5.2 Hz, 2H), 2.88 (t, J=7.8 Hz, 4H), 1.69 (quin, J=7.6 Hz, 4H), 1.4-1.2 (m, 36H), 0.87 (t, J=6.7 Hz, 6H); $^{13}$C-NMR (75 MHz, THF-$d_8$, RT, δ in ppm) 141.7, 138.0, 137.9, 135.9, 131.6 131.2, 126.0, 121.6, 119.3, 33.1, 31.9, 30.80, 30.76 (multiple peaks), 30.6, 30.5, 30.3, 23.7, 14.6; elemental analysis: found 73.10% C, 8.27% H, 18.50% S—calculated: 72.99% C, 8.46% H, 18.56% S

EXAMPLE 13

Transistor Characterization

Field-effect transistors for the polymer series are fabricated in the standard setup: highly doped silicon wafers with silicon dioxide dielectric are treated with HMDS to protect the hydroxy groups at the interface. The polymers are spin cast from a 5 mg/ml solution in dichlorobenzene to form a 30-50 nm thick film. Top-contact gold electrodes are deposited from the gas phase. The measurements are run in a nitrogen atmosphere with yellow light. Charge carrier mobilities and on-off ratios thus determined are compiled in the below table 2.

EXAMPLE 14

Solid Morphology

For more information upon the bulk morphology of the polymer series, the materials are extruded as a fiber. The two-dimensional diffraction of an X-ray beam reveals both the π-stacking distance and the packing mode. As summarized in Table 2, the π-stacking distance is basically unaffected by the extent of curvature in the polymer. In all cases, a value between 0.37 and 0.38 nm is found. This value is about the same as in polymers with the highest charge-carrier mobility.

TABLE 2

Morphology data obtained from fiber X-ray scattering: a. π-stacking distance; b. lamellar distance; and the performance in field-effect transistors on silicon substrates with a top-contact bottom-gate setup: c. saturation field-effect mobility; d. on-off ratio.

| Polymer | $d_{\pi-\pi}{}^a$/nm | $d_{lam}{}^b$/nm | $\mu_{sat}{}^c$ $cm^2V^{-1}s^{-1}$ | $I_{on}/I_{off}{}^d$ |
|---|---|---|---|---|
| P4 | 0.37 | 3.1 | $3.0 \cdot 10^{-4}$ | $6.8 \cdot 10^2$ |
| P5 | 0.38 | 2.9 | $1.8 \cdot 10^{-4}$ | $2.0 \cdot 10^3$ |

EXAMPLE 15

Organic Bulk Heterojunction Solar Cell

The solar cell has the following structure: Al electrode/LiF layer/organic layer, including compound of the invention/ [poly(3,4-ethylenedioxy-thiophene) (PEDOT): poly(styrenesulfonic acid) (PSS)]/ITO electrode/glass substrate. The solar cells are made by spin coating a layer of the PEDOT:PSS on a pre-patterned ITO on glass substrate. Then a 1:1 mixture of the compound P4 or P5 (1% by weight) : [60]PCBM or [70]PCBM (a substituted $C_{60}$ or $C_{70}$ fullerene) is spin coated (organic layer). LiF and Al are sublimed under high vacuum through a shadow-mask.

Solar Cell Performance

The solar cell characteristics are measured with a solar light simulator under AM1.5 conditions. The current is also calculated from the with the External Quantum Efficiency (EQE) measurement.

EXAMPLE 16

Synthesis and Application of Polymer 16

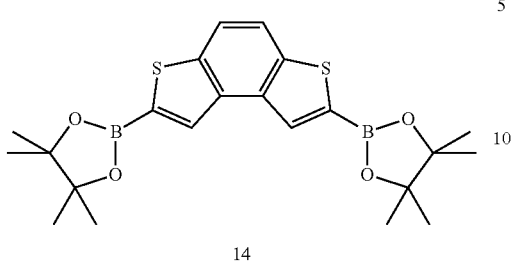

14 a) To a cooled (−78° C.) solution of 1.05 g 1 in 20 ml of dry THF is added 4.5 ml butyl lithium (2.5 M in hexane). The resulting solution is stirred for 15 minutes at 0° C. and cooled to −78° C. 5.2 g 2-isopropoxy-4,4,5,5-tetramethyl-1,3,2-dioxoborolane are added dropwise, kept 5 minutes at −78° C., then the solution is slowly warmed to room temperature and stir-ring is continued for 30 minutes. The reaction is quenched by adding 50ml HCl (10%) and the product is extracted twice with 40 ml ethyl acetate. The combined organic extracts are dried and evaporated to give crude 14, which is purified by crystallisations from diisopropylether:toluene 9:1, affords 1.77 g of 14 as white powder.

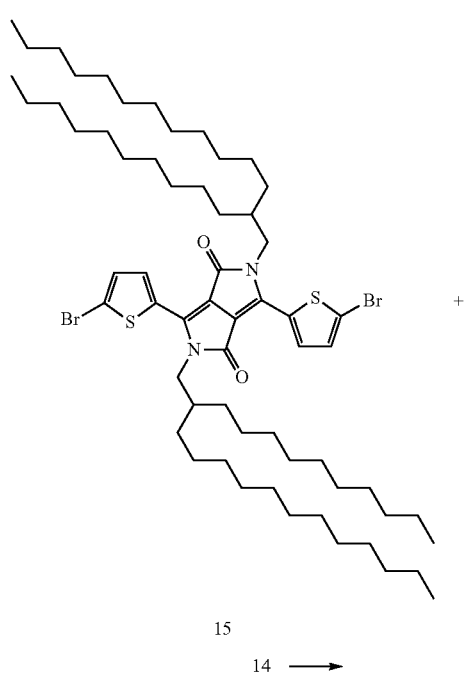

15

14 ⟶

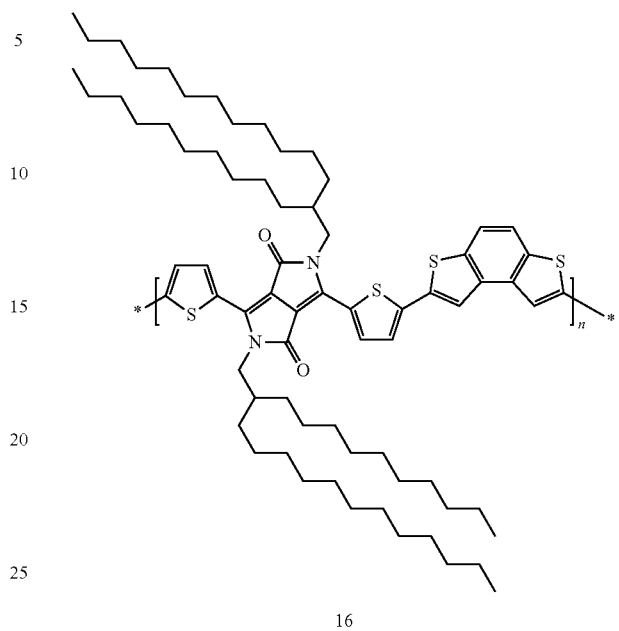

16 b) Under Argon 1.25 g of 15, 0.51 g of compound 14, 7.4 mg of Pd(acetate)2, 37.9 mg of 2-(di-tert-butyl-phosphino)-1-phenyl-pyrrole are mixed with 55 ml of tetrahydrofuran and warmed to 60° C. Then a solution of 0.29g lithium hydroxide is added to the reaction mixture. The reaction mixture then is brought to reflux for 4 hours and cooled to room temperature. The green-blue mixture is precipitated with methanol and filtered. The filtrate is dissolved in chloroform and refluxed with a 1% NaCN water solution for 3 hours. The organic phase is washed with water and then dried and evaporated. The polymer is precipitated with ethanol and the precipitate fractionated in a Soxhlet (THF, then chloroform). The chloroform fraction contains 1.04 g of the desired polymer 16.

c) Organic Bulk Heterojunction Solar Cell

A solar cell of the following structure is prepared: Al electrode/LiF layer/organic layer, including compound of the invention/[poly(3,4-ethylenedioxy-thiophene) (PEDOT): poly(styrenesulfonic acid) (PSS)]/ITO electrode/glass substrate. The solar cell is made by spin coating a layer of the PEDOT:PSS on a pre-patterned ITO on glass substrate. Then a 1:1.5 mixture of polymer 16 (1% by weight): [60]PCBM or [70]PCBM (a substituted $C_{60}$ or $C_{70}$ fullerene) is spin coated (organic layer). LiF and Al are sublimed under high vacuum through a shadow-mask.

Solar cell performance: The solar cell characteristics are measured under AM1.5 G conditions, irradiation 100 mW/cm$^2$ using a Xenon lamp based solar simulator and a device area of 0.09 cm$^2$. Under these conditions, efficiency of 1.13% is determined ($J_{sc}$=2.0 mA/cm$^2$, FF=0.65 and $V_{oc}$=0.84V).

EXAMPLE 17

Synthesis of Polymer 18

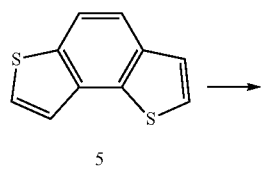

5

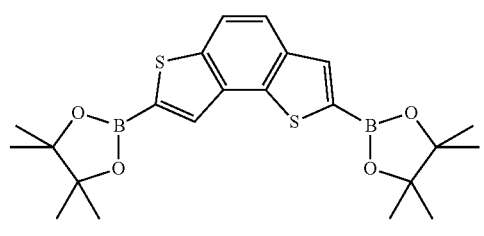

17 a) Compound 17 is prepared according the procedure of compound 14 described in example 16.

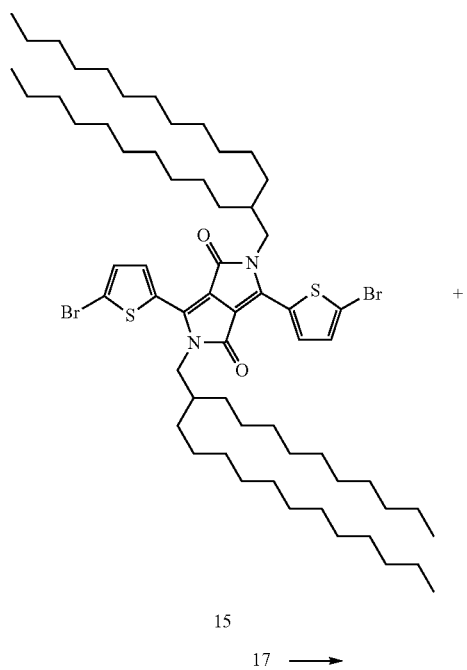

15

17 →

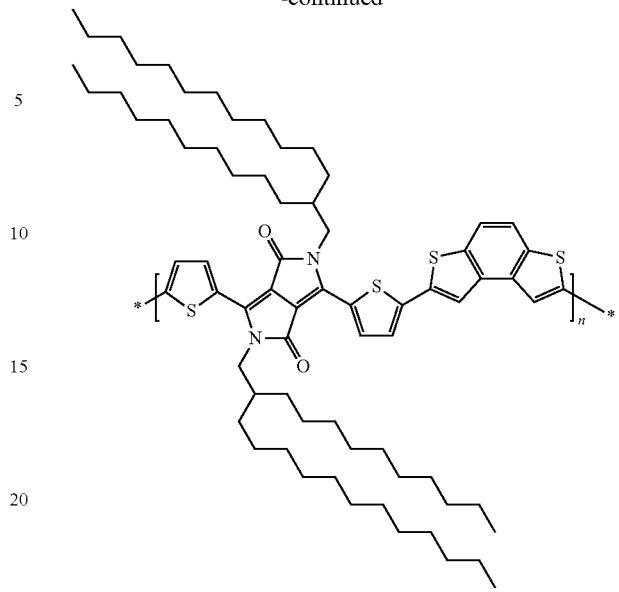

18 b) Polymer 18 is prepared in analogy the procedure described for the preparation of polymer 16 in example 16.

The invention claimed is:
1. An organic semiconductor material, which comprises a copolymer of the formula

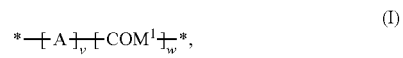 (I)

wherein
v and w each are from the range 4 to 1000,
the weight ratio v:w is from the range 1:20 to 20:1;
-A- is a benzodithiophene repeating unit of formula II or III

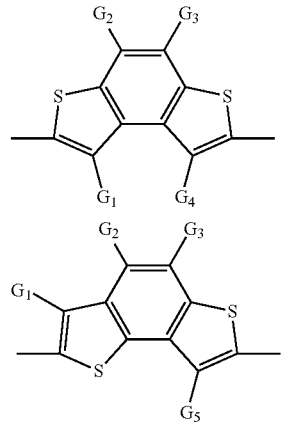

and
-COM- is selected from repeating units of formulae

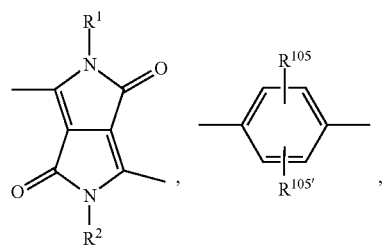

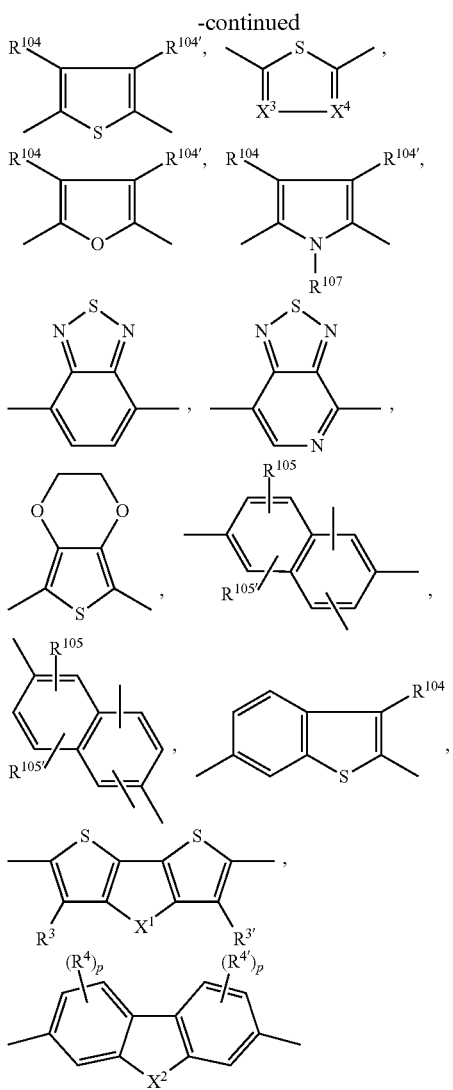

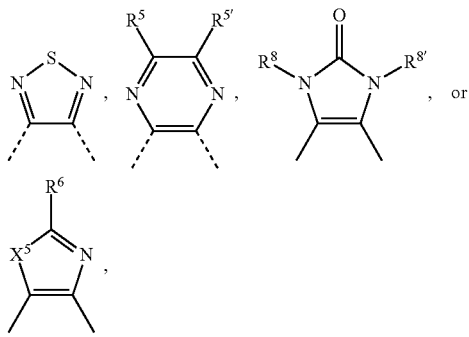

and combinations thereof,
wherein
$G_1$, $G_2$, $G_3$, $G_4$ and $G_5$ are the same or different and are hydrogen or halogen or are $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, $C_4$-$C_{25}$aryl, $C_5$-$C_{25}$alkylaryl or $C_5$-$C_{25}$aralkyl, each of which is unsubstituted or substituted by one or more halogen, hydroxy, nitro, —CN or $C_6$-$C_{18}$aryl groups, where any alkyl of 2 or more carbon atoms may be interrupted by —O—, —COO—, —OCO— or —S—;

$R^1$ and $R^2$ are the same or different and are hydrogen, a $C_1$-$C_{100}$alkyl group,
—COOR$^{103}$, a $C_1$-$C_{100}$alkyl group which is substituted by one or more halogen atoms, hydroxyl groups, nitro groups, —CN or $C_6$-$C_{18}$aryl groups and/or which is interrupted by —O—, —COO—, —OCO— or —S—; a $C_7$-$C_{100}$arylalkyl group, a carbamoyl group, $C_5$-$C_{12}$cycloalkyl which can be substituted one to three times with $C_1$-$C_8$alkyl and/or $C_1$-$C_8$alkoxy, a $C_6$-$C_{24}$aryl group which can be substituted one to three times with $C_1$-$C_8$alkyl, $C_1$-$C_8$thioalkoxy and/or $C_1$-$C_8$alkoxy, or pentafluorophenyl;

p is 0, 1, 2 or 3;

$R^3$ and $R^{3'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;

$R^4$ and $R^{4'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;

$X^1$ and $X^2$ are independently of each other —O—, —S—, —NR$^8$—, —Si(R$^{11}$)(R$^{11'}$)—, —C(R$^7$)(R$^{7'}$)—, —C(=O)—, one of $X^3$ and $X^4$ is N and the other is CR$^{99}$;
$X^5$ is —O— or —NR$^8$—;

$R^5$ and $R^{5'}$ are independently of each other hydrogen, halogen, $C_1$-$C_{25}$alkyl which may optionally be interrupted by one or more oxygen or sulphur atoms; $C_6$-$C_{24}$aryl which may optionally be substituted one to three times with $C_1$-$C_8$alkyl and/or $C_1$-$C_8$alkoxy; $C_7$-$C_{25}$arylalkyl, CN or $C_1$-$C_{25}$alkoxy; or $R^5$ and $R^{5'}$ together form a ring, $R^6$ is H, $C_1$-$C_{18}$alkyl which may optionally be interrupted by one or more oxygen or sulphur atoms, $C_1$-$C_{18}$perfluoroalkyl, $C_6$-$C_{24}$aryl which may optionally be substituted one to three times with $C_1$-$C_8$alkyl and/or $C_1$-$C_8$alkoxy; $C_2$-$C_{20}$heteroaryl which may optionally be substituted one to three times with $C_1$-$C_8$alkyl and/or $C_1$-$C_8$alkoxy; or CN, $R^7$ and $R^{7'}$ are independently of each other hydrogen, $C_1$-$C_{35}$alkyl which may optionally be interrupted by one or more oxygen or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl or $C_1$-$C_{18}$alkoxy; $C_1$-$C_{25}$alkyl which may optionally be interrupted by one or more oxygen or sulphur atoms; or $C_7$-$C_{25}$arylalkyl, $R^{11}$ and $R^{11'}$ are independently of each other $C_1$-$C_{35}$alkyl group, $C_7$-$C_{25}$arylalkyl or a phenyl group which optionally can be substituted one to three times with $C_1$-$C_8$alkyl and/or $C_1$-$C_8$alkoxy;

$R_{103}$ is $C_1$-$C_{50}$alkyl;

$R^{99}$, $R^{104}$ and $R^{104'}$ are independently of each other hydrogen, halogen, a $C_1$-$C_{25}$alkyl group which may optionally be interrupted by one or more oxygen or sulphur atoms, $C_7$-$C_{25}$arylalkyl or a $C_1$-$C_{25}$alkoxy group, $R^{105}$ and $R^{105'}$ independently of each other are hydrogen, halogen, $C_1$-$C_{25}$alkyl which may optionally be interrupted by one or more oxygen or sulphur atoms; $C_7$-$C_{25}$arylalkyl or $C_1$-$C_{18}$alkoxy and $R^{107}$ is H; $C_6$-$C_{18}$aryl; $C_6$-$C_{18}$aryl which is substituted by $C_1$-$C_{18}$alkyl or $C_1$-$C_{18}$alkoxy; $C_1$-$C_{18}$alkyl; or $C_2$-$C_{18}$alkyl which is interrupted by —O—.

2. The organic semiconductor material of claim 1 in the form of a composite comprising a substrate, wherein a thin film semiconductor comprising the copolymer of the formula (I) is deposited on the substrate.

3. A semiconductor device, which comprises a copolymer of the formula

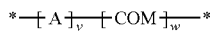 (I')

wherein v and w each are from the range 4 to 1000, the weight ratio v:w is from the range 1:20 to 20:1;

-A- is a benzodithiophene repeating unit of formula II or III

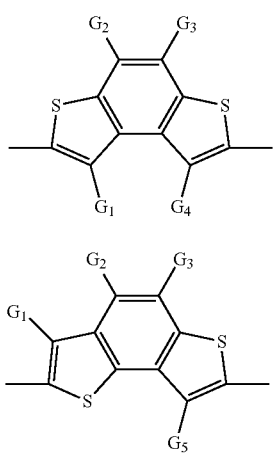

and

-COM- is selected from repeating units of formulae

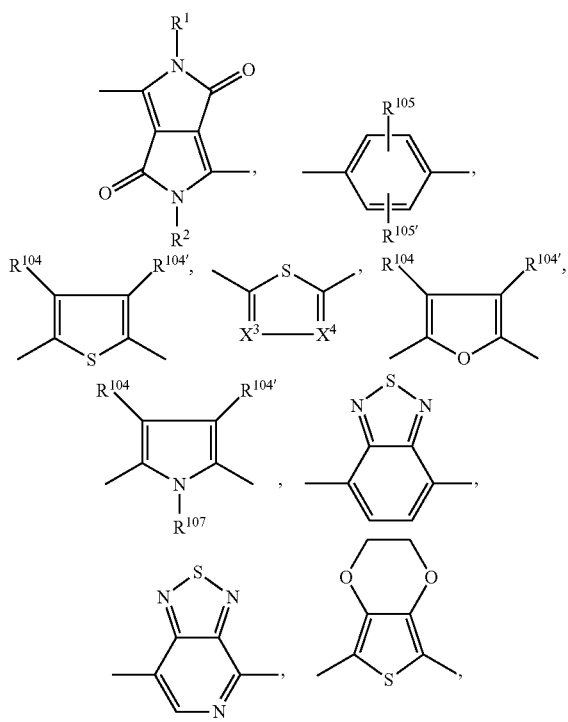

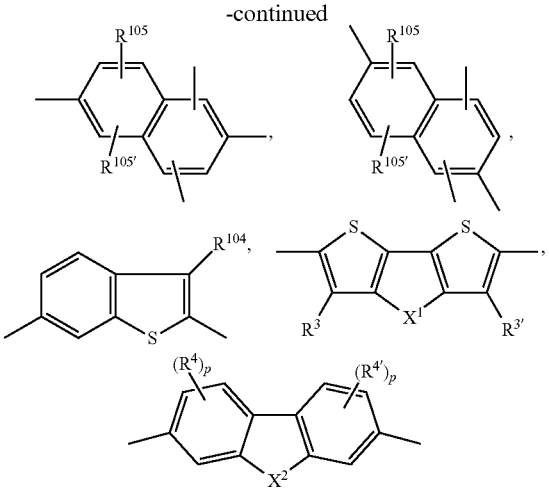

and combinations thereof, wherein $G_1$, $G_2$, $G_3$, $G_4$ and $G_5$ are the same or different and are hydrogen or halogen or are $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, $C_4$-$C_{25}$aryl, $C_5$-$C_{25}$alkylaryl or $C_5$-$C_{25}$aralkyl, each of which is unsubstituted or substituted by one or more halogen, hydroxy, nitro, —CN or $C_6$-$C_{18}$aryl groups, where any alkyl of 2 or more carbon atoms may be interrupted by —O—, —COO—, —OCO— or —S—;

$R^1$ and $R^2$ are the same or different and are hydrogen, a $C_1$-$C_{100}$alkyl group, —COOR$^{103}$, a $C_1$-$C_{100}$alkyl group which is substituted by one or more halogen atoms, hydroxyl groups, nitro groups, —CN or $C_6$-$C_{18}$aryl groups and/or which is interrupted by —O—, —COO—, —OCO— or —S—; a $C_7$-$C_{100}$arylalkyl group, a carbamoyl group, $C_5$-$C_{12}$cycloalkyl which can be substituted one to three times with $C_1$-$C_8$alkyl and/or $C_1$-$C_8$alkoxy, a $C_6$-$C_{24}$aryl group which can be substituted one to three times with $C_1$-$C_8$alkyl, $C_1$-$C_8$thioalkoxy and/or $C_1$-$C_8$alkoxy, or pentafluorophenyl;

p is 0, 1, 2 or 3;

$R^3$ and $R^{3'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;

$R^4$ and $R^{4'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;

$X^1$ and $X^2$ are independently of each other —O—, —S—, —NR$^8$—, —Si(R$^{11}$)(R$^{11'}$)—, —C(R$^7$)(R$^{7'}$)—, —C(═O)—,

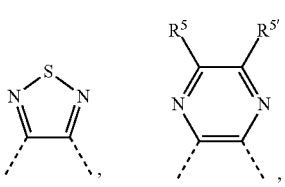

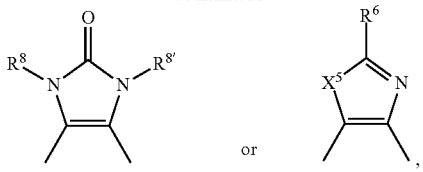

one of $X^3$ and $X^4$ is N and the other is $CR^{99}$;
$X^5$ is —O— or —$NR^8$—;
$R^5$ and $R^{5'}$ are independently of each other hydrogen, halogen, $C_1$-$C_{25}$alkyl which may optionally be interrupted by one or more oxygen or sulphur atoms; $C_6$-$C_{24}$aryl which may optionally be substituted one to three times with $C_1$-$C_8$alkyl and/or $C_1$-$C_8$alkoxy; $C_7$-$C_{25}$arylalkyl, CN or $C_1$-$C_{25}$alkoxy; or
$R^5$ and $R^{5'}$ together form a ring,
$R^6$ is H, $C_1$-$C_{18}$alkyl which may optionally be interrupted by one or more oxygen or sulphur atoms, $C_1$-$C_{18}$perfluoroalkyl, $C_6$-$C_{24}$aryl which may optionally be substituted one to three times with $C_1$-$C_8$alkyl and/or $C_1$-$C_8$alkoxy; $C_2$-$C_{20}$heteroaryl which may optionally be substituted one to three times with $C_1$-$C_8$alkyl and/or $C_1$-$C_8$alkoxy; or CN,
$R^7$ and $R^{7'}$ are independently of each other hydrogen, $C_1$-$C_{35}$alkyl which may optionally be interrupted by one or more oxygen or sulphur atoms; or $C_7$-$C_{25}$arylalkyl,
$R^8$ and $R^{8'}$ are independently of each other hydrogen, $C_6$-$C_{18}$aryl; $C_6$-$C_{18}$aryl which is substituted by $C_1$-$C_{18}$alkyl or $C_1$-$C_{18}$alkoxy; $C_1$-$C_{25}$alkyl which may optionally be interrupted by one or more oxygen or sulphur atoms; or $C_7$-$C_{25}$arylalkyl,
$R^{11}$ and $R^{11'}$ are independently of each other $C_1$-$C_{35}$alkyl group, $C_7$-$C_{25}$arylalkyl or a phenyl group which optionally can be substituted one to three times with $C_1$-$C_8$alkyl and/or $C_1$-$C_8$alkoxy;
$R_{103}$ is $C_1$-$C_{50}$alkyl;
$R^{99}$, $R^{104}$ and $R^{104'}$ are independently of each other hydrogen, halogen, a $C_1$-$C_{25}$alkyl group which may optionally be interrupted by one or more oxygen or sulphur atoms, $C_7$-$C_{25}$arylalkyl or a $C_1$-$C_{25}$alkoxy group,
$R^{105}$ and $R^{105'}$ independently of each other are hydrogen, halogen, $C_1$-$C_{25}$alkyl which may optionally be interrupted by one or more oxygen or sulphur atoms; $C_7$-$C_{25}$arylalkyl or $C_1$-$C_{18}$alkoxy and
$R^{107}$ is H; $C_6$-$C_{18}$aryl; $C_6$-$C_{18}$aryl which is substituted by $C_1$-$C_{18}$alkyl or $C_1$-$C_{18}$alkoxy; $C_1$-$C_{18}$alkyl; or $C_2$-$C_{18}$alkyl which is interrupted by —O—.

4. The semiconductor device according to claim 3, which is an organic photovoltaic device, diode, photodiode or an organic field effect transistor.

5. The material according to claim 1, where in the copolymer of the formula (I)
$G_1$, $G_2$, $G_3$, $G_4$ and $G_5$ independently are hydrogen or fluoro or are $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, phenyl, naphthyl, $C_1$-$C_{12}$alkylphenyl or phenyl-$C_1$-$C_{12}$alkyl, each of which is unsubstituted or substituted by one or more fluoro, —CN, phenyl or naphthyl;
$R^1$ and $R^2$ are the same or different and are $C_1$-$C_{100}$alkyl, $C_5$-$C_{12}$cycloalkyl which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or are —$CR^{101}R^{102}$—$(CH_2)_u$-$A^3$, wherein $R^{101}$ and $R^{102}$ stand for hydrogen or $C_1$-$C_4$alkyl, $A^3$ stands for phenyl or 1- or 2-naphthyl each of which can be substituted one to three times with $C_1$-$C_8$alkyl and/or $C_1$-$C_8$alkoxy and u stands for 0, 1, 2 or 3;
$R^{103}$ is $C_1$-$C_{25}$alkyl;
one of $X^3$ and $X^4$ is N and the other is $CR^{99}$,
$R^{99}$, $R^{104}$ and $R^{104'}$ are independently of each other hydrogen, F, a $C_1$-$C_{25}$alkyl group which may optionally be interrupted by one or more oxygen or sulphur atoms, $C_7$-$C_{25}$phenylalkyl or $C_1$-$C_{12}$alkoxy,
$R^{105}$ and $R^{105'}$ independently of each other are hydrogen, fluoro, $C_1$-$C_{25}$alkyl which may optionally be interrupted by one or more oxygen or sulphur atoms; $C_7$-$C_{25}$phenylalkyl or $C_1$-$C_{18}$alkoxy and
$R^{107}$ is H; phenyl or naphthyl which is optionally substituted by $C_1$-$C_{18}$alkyl or $C_1$-$C_{18}$alkoxy; $C_1$-$C_{18}$alkyl; or $C_2$-$C_{18}$alkyl which is interrupted by —O—.

6. The material according to claim 1, where in the copolymer of the formula (I),
the sequence of units [A] and [COM] is statistical, in blocks; and
the moiety -COM- is selected from repeating units of the formulae

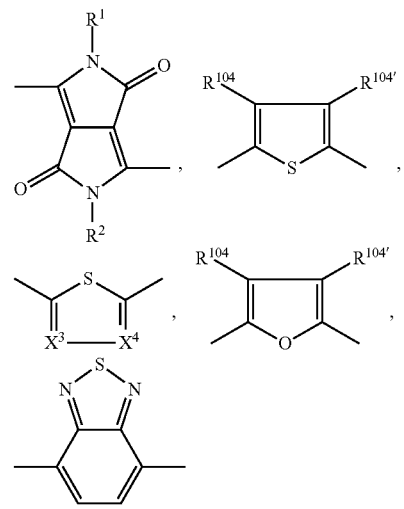

and combinations thereof.

7. The material according to claim 1, where in the copolymer of the formula (I) the moiety -COM- is selected from repeating units of the formulae (IVa)-(IVk) and (IVm)

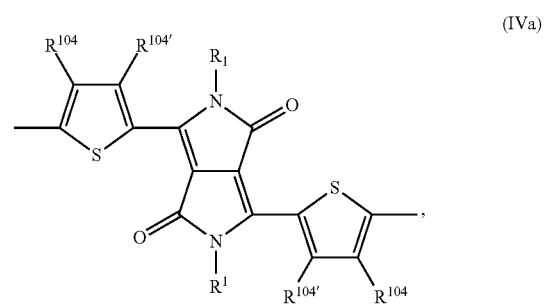

(IVa)

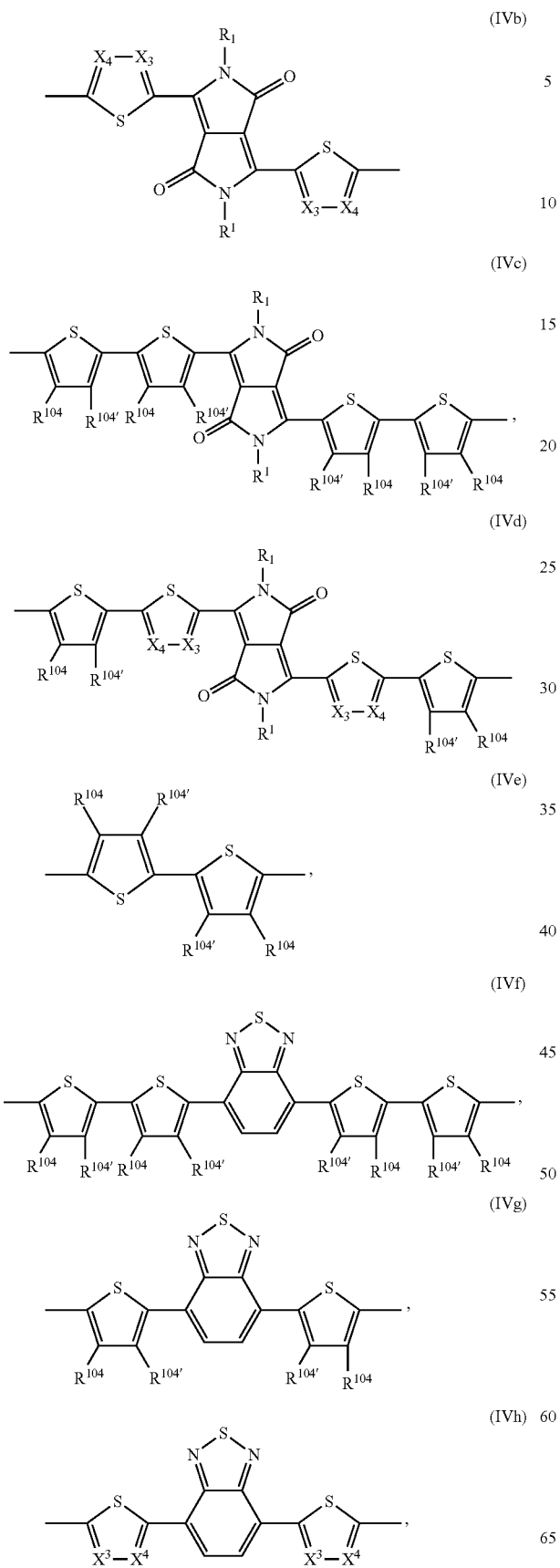
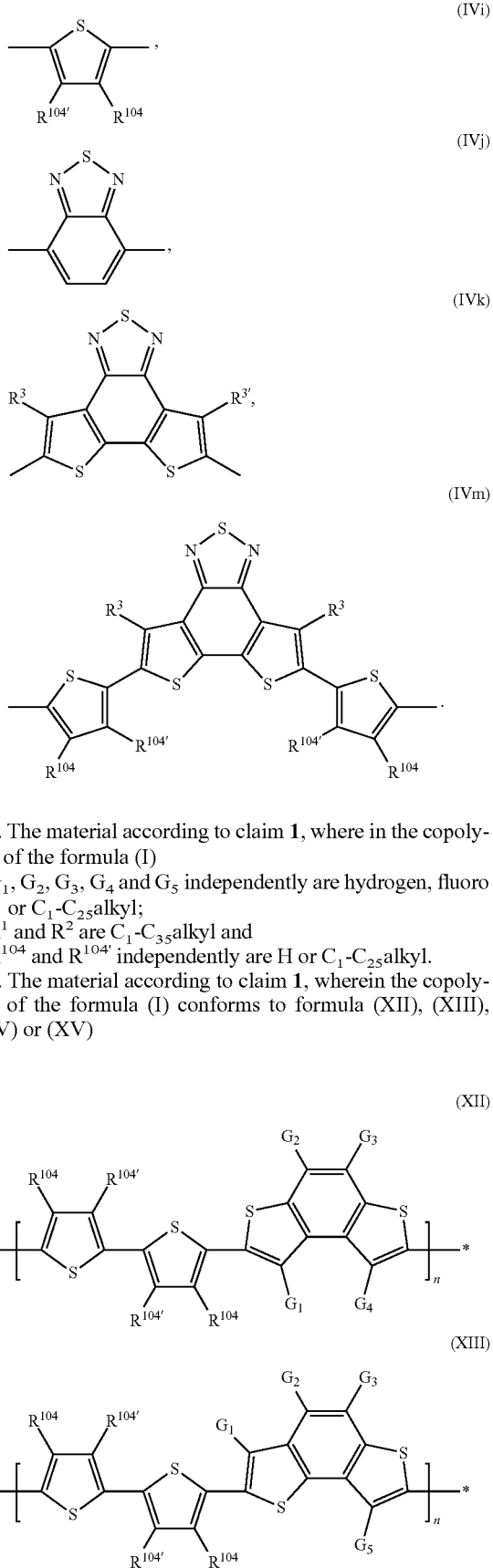
8. The material according to claim 1, where in the copolymer of the formula (I)
 $G_1$, $G_2$, $G_3$, $G_4$ and $G_5$ independently are hydrogen, fluoro or $C_1$-$C_{25}$alkyl;
 $R^1$ and $R^2$ are $C_1$-$C_{35}$alkyl and
 $R^{104}$ and $R^{104'}$ independently are H or $C_1$-$C_{25}$alkyl.
9. The material according to claim 1, wherein the copolymer of the formula (I) conforms to formula (XII), (XIII), (XIV) or (XV)

-continued

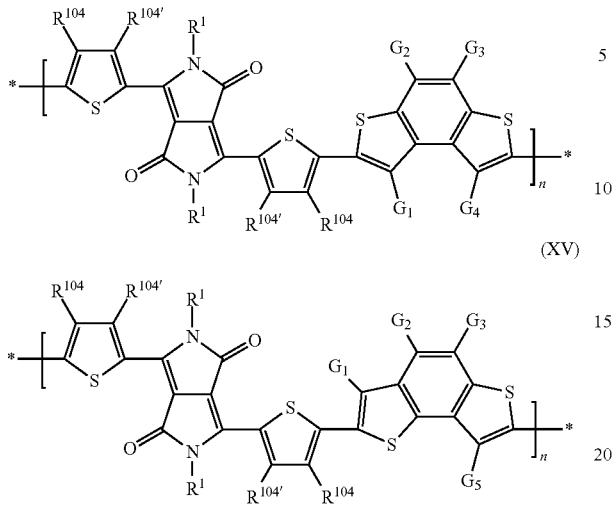

wherein n ranges from 4 to 300.

10. The material according to claim 1, wherein the weight average molecular weight, Mw, of the copolymer of the formula (I) is from 5000 to about 200000.

11. A copolymer of the formula

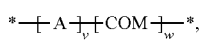

wherein
v and w each are from the range 4 to 1000,
the weight ratio v:w is from the range 1:20 to 20:1;
-A- is a benzodithiophene repeating unit of formula II or III

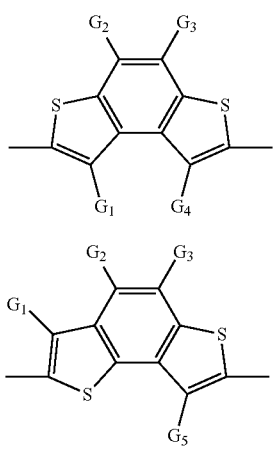

and
-COM- is selected from repeating units of formulae

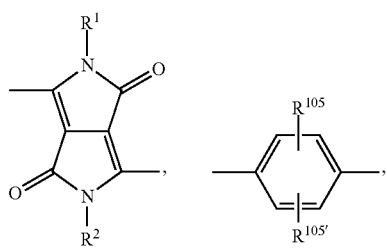

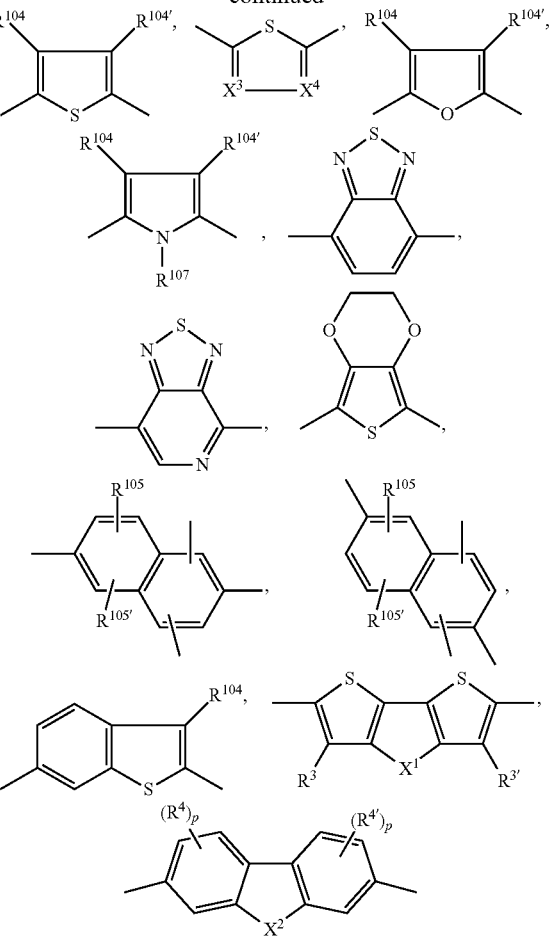

and combinations thereof,
wherein
$G_1$, $G_2$, $G_3$, $G_4$ and $G_5$ are the same or different and are hydrogen or halogen or are $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, $C_4$-$C_{25}$aryl, $C_5$-$C_{25}$alkylaryl or $C_5$-$C_{25}$aralkyl, each of which is unsubstituted or substituted by one or more halogen, hydroxy, nitro, —CN or $C_6$-$C_{18}$aryl groups, where any alkyl of 2 or more carbon atoms may be interrupted by —O—, —COO—, —OCO— or —S—;
$R^1$ and $R^2$ are the same or different and are hydrogen, a $C_1$-$C_{100}$alkyl group,
—COOR$^{103}$, a $C_1$-$C_{100}$alkyl group which is substituted by one or more halogen atoms, hydroxyl groups, nitro groups, —CN or $C_6$-$C_{18}$aryl groups and/or which is interrupted by —O—, —COO—, —OCO— or —S—; a $C_7$-$C_{100}$arylalkyl group, a carbamoyl group, $C_5$-$C_{12}$cycloalkyl which can be substituted one to three times with $C_1$-$C_8$alkyl and/or $C_1$-$C_8$alkoxy, a $C_6$-$C_{24}$aryl group which can be substituted one to three times with $C_1$-$C_8$alkyl, $C_1$-$C_8$thioalkoxy and/or $C_1$-$C_8$alkoxy, or pentafluorophenyl;
p is 0, 1, 2 or 3;
$R^3$ and $R^{3'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;
$R^4$ and $R^{4'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;

$X^1$ and $X^2$ are independently of each other —O—, —S—, —NR$^8$—, —Si(R$^{11}$)(R$^{11'}$)—, —C(R$^7$)(R$^{7'}$)—, —C(=O)—,

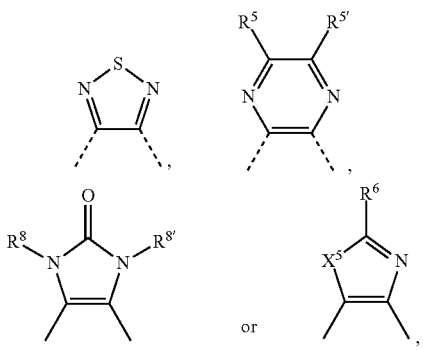

one of $X^3$ and $X^4$ is N and the other is CR$^{99}$;

$X^5$ is —O— or —NR$^8$—;

$R^5$ and $R^{5'}$ are independently of each other hydrogen, halogen, $C_1$-$C_{25}$alkyl which may optionally be interrupted by one or more oxygen or sulphur atoms; $C_6$-$C_{24}$aryl which may optionally be substituted one to three times with $C_1$-$C_8$alkyl and/or $C_1$-$C_8$alkoxy; $C_7$-$C_{25}$arylalkyl, CN or $C_1$-$C_{25}$alkoxy; or $R^5$ and $R^{5'}$ together form a ring, $R^6$ is H, $C_1$-$C_{18}$alkyl which may optionally be interrupted by one or more oxygen or sulphur atoms, $C_1$-$C_{18}$perfluoroalkyl, $C_6$-$C_{24}$aryl which may optionally be substituted one to three times with $C_1$-$C_8$alkyl and/or $C_1$-$C_8$alkoxy; $C_2$-$C_{20}$heteroaryl which may optionally be substituted one to three times with $C_1$-$C_8$alkyl and/or $C_1$-$C_8$alkoxy; or CN, $R^7$ and $R^{7'}$ are independently of each other hydrogen, $C_1$-$C_{35}$alkyl which may optionally be interrupted by one or more oxygen or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl or $C_1$-$C_{18}$alkoxy; $C_1$-$C_{25}$alkyl which may optionally be interrupted by one or more oxygen or sulphur atoms; or $C_7$-$C_{25}$arylalkyl, $R^{11}$ and $R^{11'}$ are independently of each other $C_1$-$C_{35}$alkyl group, $C_7$-$C_{25}$arylalkyl or a phenyl group which optionally can be substituted one to three times with $C_1$-$C_8$alkyl and/or $C_1$-$C_8$alkoxy;

$R_{103}$ is $C_1$-$C_{50}$alkyl;

$R^{99}$, $R^{104}$ and $R^{104'}$ are independently of each other hydrogen, halogen, a $C_1$-$C_{25}$alkyl group which may optionally be interrupted by one or more oxygen or sulphur atoms, $C_7$-$C_{25}$arylalkyl or a $C_1$-$C_{25}$alkoxy group, $R^{105}$ and $R^{105'}$ independently of each other are hydrogen, halogen, $C_1$-$C_{25}$alkyl which may optionally be interrupted by one or more oxygen or sulphur atoms; $C_7$-$C_{25}$arylalkyl or $C_1$-$C_{18}$alkoxy and $R^{107}$ is H; $C_6$-$C_{18}$aryl; $C_6$-$C_{18}$aryl which is substituted by $C_1$-$C_{18}$alkyl or $C_1$-$C_{18}$alkoxy; $C_1$-$C_{18}$alkyl; or $C_2$-$C_{18}$alkyl which is interrupted by —O—.

12. A composition comprising one or more copolymers of the formula (I) as defined in claim 11 dissolved or dispersed in a liquid medium.

13. A process for preparation of an organic semiconductor material in the form of a composite comprising a substrate, which process comprises dissolving a copolymer of the formula (I) as defined in claim 11 in a liquid medium to form a solution, depositing the solution on a substrate by spin coating, drop casting, dip coating or printing and removing the solvent to form a thin film semiconductor on the substrate.

14. A process for the preparation of a copolymer of formula (II'),

 (II')

which process comprises
reacting a dihalogenide of formula

with an essentially equimolar amount of a diboronic acid or diboronate corresponding to formula

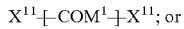; or reacting a dihalogenide of formula

with an essentially equimolar amount of a diboronic acid or diboronate corresponding to formula

, wherein
$X^{10}$ is halogen and
$X^{11}$ is independently in each occurrence —B(OH)$_2$, —B(OY$^1$)$_2$,

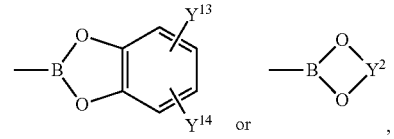

wherein
$Y^1$ is independently in each occurrence a $C_1$-$C_{10}$alkyl group and $Y^2$ is independently in each occurrence a $C_2$-$C_{10}$alkylene group and
$Y^{13}$ and $Y^{14}$ are independently of each other hydrogen or a $C_1$-$C_{10}$alkyl group,
in a solvent and in the presence of a catalyst; or
reacting a dihalogenide of formula

with an equimolar amount of an organo tin compound corresponding to formula

; or reacting a dihalogenide of formula

with an equimolar amount of an organo tin compound corresponding to formula

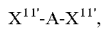, wherein
$X^{11'}$ is independently in each occurrence —SnR$^{207}$R$^{208}$R$^{209}$, wherein R$^{207}$, R$^{208}$ and R$^{209}$ are identical or different and are H or $C_1$-$C_6$alkyl, or two of the groups R$^{207}$, R$^{208}$ and R$^{209}$ form a ring and these groups are optionally branched and wherein
-A- is a benzodithiophene unit of formula II or III

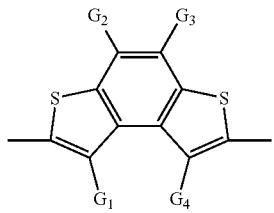 (II)

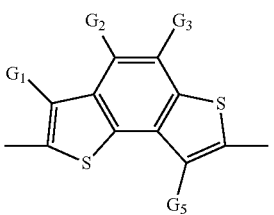 (III)

and
-COM$^1$- is selected from units of formulae

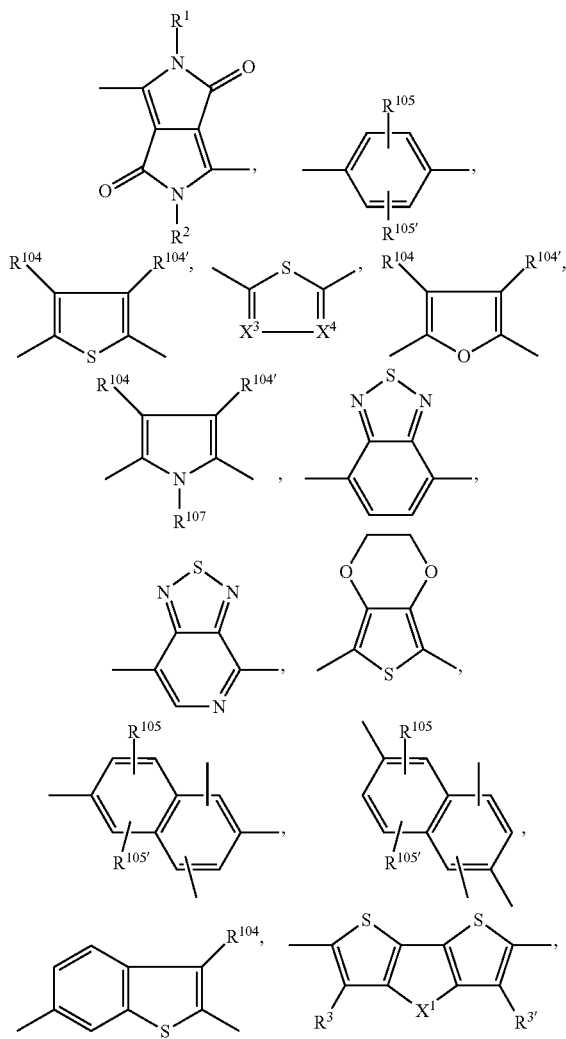

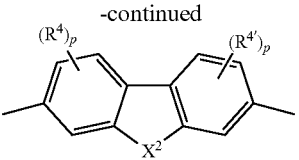

and combinations thereof,
wherein
$G_1$, $G_2$, $G_3$, $G_4$ and $G_5$ are the same or different and are hydrogen or halogen or are $C_1$-$C_{25}$alkyl, O- and/or S-interrupted $C_2$-$C_{25}$alkyl, $C_1$-$C_{25}$alkoxy, $C_3$-$C_{12}$cycloalkyl, $C_2$-$C_{25}$alkenyl, $C_2$-$C_{25}$alkynyl, $C_4$-$C_{25}$aryl, $C_5$-$C_{25}$alkylaryl or $C_5$-$C_{25}$aralkyl, each of which is unsubstituted or substituted by one or more halogen, hydroxy, nitro, —CN or $C_6$-$C_{18}$aryl groups, where any alkyl of 2 or more carbon atoms may be interrupted by —O—, —COO—, —OCO— or —S—;
$R^1$ and $R^2$ are the same or different and are hydrogen, a $C_1$-$C_{100}$alkyl group,
—COOR$^{103}$, a $C_1$-$C_{100}$alkyl group which is substituted by one or more halogen atoms, hydroxyl groups, nitro groups, —CN or $C_6$-$C_{18}$aryl groups and/or which is interrupted by —O—, —COO—, —OCO— or —S—; a $C_7$-$C_{100}$arylalkyl group, a carbamoyl group, $C_5$-$C_{12}$cycloalkyl which can be be substituted one to three times with $C_1$-$C_8$alkyl, $C_1$-$C_8$thioalkoxy and/or $C_1$-$C_8$alkoxy, or pentafluorophenyl;
p is 0, 1, 2 or 3;
$R^3$ and $R^{3'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;
$R^4$ and $R^{4'}$ are independently of each other hydrogen, halogen, $C_1$-$C_{25}$alkyl which may optionally be interrupted by one or more oxygen or sulphur atoms; $C_7$-$C_{25}$arylalkyl or $C_1$-$C_{25}$alkoxy;
$X^1$ and $X^2$ are independently of each other —O—, —S—, —NR$^8$—, —Si(R$^{11}$)(R$^{11'}$)—, —C(R$^7$)(R$^{7'}$)—, —C(=O)—,

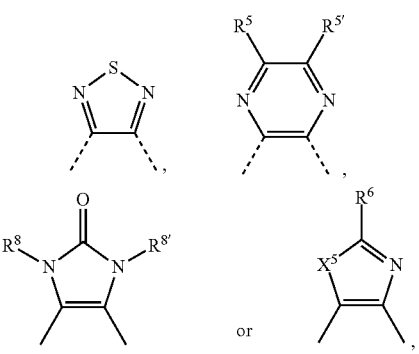

one of $X^3$ and $X^4$ is N and the other is CR$^{99}$;
$X^5$ is —O— or —NR$^8$—;
$R^5$ and $R^{5'}$ are independently of each other hydrogen, halogen, $C_1$-$C_{25}$alkyl which may optionally be interrupted by one or more oxygen or sulphur atoms; $C_6$-$C_{24}$aryl which may optionally be substituted one to three times with $C_1$-$C_8$alkyl and/or $C_1$-$C_8$alkoxy; $C_7$-$C_{25}$arylalkyl, CN or $C_1$-$C_{25}$alkoxy; or
$R^5$ and $R^{5'}$ together form a ring, $R^6$ is H, $C_1$-$C_{18}$alkyl which may optionally be interrupted by one or more oxygen or sulphur atoms, $C_1$-$C_{18}$perfluoroalkyl, $C_6$-$C_{24}$aryl which may optionally be substituted one to three times with $C_1$-$C_8$alkyl and/or $C_1$-$C_8$alkoxy; $C_2$-$C_{20}$heteroaryl which may optionally be substituted one to three times with $C_1$-$C_8$alkyl and/or $C_1$-$C_8$alkoxy; or CN, $R^7$ and $R^{7'}$ are independently of each other hydrogen, $C_1$-$C_{35}$alkyl which may optionally be interrupted by one or more oxygen or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl or $C_1$-$C_{18}$alkoxy; $C_1$-$C_{25}$alkyl which may optionally be interrupted by one or more oxygen or sulphur atoms; or $C_7$-$C_{25}$arylalkyl, $R^{11}$ and $R^{11'}$ are independently of each other $C_1$-$C_{35}$alkyl group, $C_7$-$C_{25}$arylalkyl or a phenyl group which optionally can be substituted one to three times with $C_1$-$C_8$alkyl and/or $C_1$-$C_8$alkoxy;

$R_{103}$ is $C_1$-$C_{50}$alkyl;

$R^{99}$, $R^{104}$ and $R^{104'}$ are independently of each other hydrogen, halogen, a $C_1$-$C_{25}$alkyl group which may optionally be interrupted by one or more oxygen or sulphur atoms, $C_7$-$C_{25}$arylalkyl or a $C_1$-$C_{25}$alkoxy group, $R^{105}$ and $R^{105'}$ independently of each other are hydrogen, halogen, $C_1$-$C_{25}$alkyl which may optionally be interrupted by one or more oxygen or sulphur atoms; $C_7$-$C_{25}$arylalkyl or $C_1$-$C_{18}$alkoxy and $R^{107}$ is H; $C_6$-$C_{18}$aryl; $C_6$-$C_{18}$aryl which is substituted by $C_1$-$C_{18}$alkyl or $C_1$-$C_{18}$alkoxy; $C_1$-$C_{18}$alkyl; or $C_2$-$C_{18}$alkyl which is interrupted by —O—.

15. The material according to claim 6, where v and w each are from the range 4 to 200.

16. The material according to claim 8, wherein $G_1$, $G_2$, $G_3$, $G_4$ and $G_5$ are hydrogen; and $R^1$ and $R^2$ are an $C_8$-$C_{35}$alkyl group.

17. The material according to claim 9, wherein n ranges from 10 to 200.

18. The material according to claim 10, wherein the weight average molecular weight of the copolymer of the formula (I) is from 10000 to about 120000.

* * * * *